(12) United States Patent
Sandhu

(10) Patent No.: US 10,141,262 B2
(45) Date of Patent: Nov. 27, 2018

(54) ELECTRICALLY CONDUCTIVE LAMINATE STRUCTURES

(71) Applicant: Micron Technology, Inc., Boise, ID (US)

(72) Inventor: Gurtej S. Sandhu, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 15/975,429

(22) Filed: May 9, 2018

(65) Prior Publication Data

US 2018/0261548 A1 Sep. 13, 2018

Related U.S. Application Data

(62) Division of application No. 14/611,514, filed on Feb. 2, 2015, now Pat. No. 9,997,461, which is a division
(Continued)

(51) Int. Cl.
*H01L 23/532* (2006.01)
*H01L 21/768* (2006.01)

(52) U.S. Cl.
CPC .. *H01L 23/53276* (2013.01); *H01L 21/76805* (2013.01); *H01L 21/76843* (2013.01);
(Continued)

(58) Field of Classification Search
None
See application file for complete search history.

(56) References Cited

U.S. PATENT DOCUMENTS

| 4,492,021 A | 1/1985 | Wright et al. |
| 5,476,679 A | 12/1995 | Lewis et al. |

(Continued)

FOREIGN PATENT DOCUMENTS

| CN | 101573797 | 11/2009 |
| CN | 201180033816.9 | 11/2014 |

(Continued)

OTHER PUBLICATIONS

WO PCT/US2011/039465 IPRP, dated Jan. 14, 2013, Micron Technology, Inc.
(Continued)

*Primary Examiner* — Michelle Mandala
(74) *Attorney, Agent, or Firm* — Wells St. John P.S.

(57) ABSTRACT

Some embodiments include electrical interconnects. The interconnects may contain laminate structures having a graphene region sandwiched between non-graphene regions. In some embodiments the graphene and non-graphene regions may be nested within one another. In some embodiments an electrically insulative material may be over an upper surface of the laminate structure, and an opening may extend through the insulative material to a portion of the laminate structure. Electrically conductive material may be within the opening and in electrical contact with at least one of the non-graphene regions of the laminate structure. Some embodiments include methods of forming electrical interconnects in which non-graphene material and graphene are alternately formed within a trench to form nested non-graphene and graphene regions.

8 Claims, 26 Drawing Sheets

Related U.S. Application Data of application No. 12/833,074, filed on Jul. 9, 2010, now Pat. No. 8,946,903.

(52) U.S. Cl.
CPC .. *H01L 21/76847* (2013.01); *H01L 21/76865* (2013.01); *H01L 21/76877* (2013.01); *H01L 23/53209* (2013.01); *H01L 23/53238* (2013.01); *H01L 2924/0002* (2013.01)

(56) References Cited

U.S. PATENT DOCUMENTS

| | | | |
|---|---|---|---|
| 6,086,642 | A | 7/2000 | Fukaumi et al. |
| 6,154,358 | A | 11/2000 | Fukaumi et al. |
| 7,321,097 | B2 | 1/2008 | Engelhardt et al. |
| 8,147,704 | B2 | 4/2012 | Lee |
| 8,361,813 | B1 | 1/2013 | Niyogi et al. |
| 8,467,224 | B2 | 6/2013 | Schricker et al. |
| 8,716,863 | B2 * | 5/2014 | Wann ............... H01L 23/53276 257/478 |
| 2005/0215049 | A1 | 9/2005 | Horibe et al. |
| 2006/0281306 | A1 | 12/2006 | Gstrein et al. |
| 2007/0242412 | A1 | 10/2007 | Chacko et al. |
| 2008/0312088 | A1 | 12/2008 | Chung et al. |
| 2009/0020764 | A1 | 1/2009 | Anderson et al. |
| 2009/0029221 | A1 | 1/2009 | Goddard et al. |
| 2009/0114883 | A1 | 5/2009 | Collier et al. |
| 2009/0221130 | A1 | 9/2009 | Asano |
| 2009/0257270 | A1 | 10/2009 | Schricker et al. |
| 2009/0266590 | A1 | 10/2009 | Aoi |
| 2009/0283735 | A1 | 11/2009 | Li et al. |
| 2009/0294759 | A1 | 12/2009 | Woo et al. |
| 2009/0321860 | A1 | 12/2009 | Klostermann et al. |
| 2009/0322319 | A1 | 12/2009 | Kreupl et al. |
| 2010/0006811 | A1 | 1/2010 | Xu et al. |
| 2010/0006823 | A1 | 1/2010 | Anderson et al. |
| 2010/0021708 | A1 | 1/2010 | Kong et al. |
| 2010/0028749 | A1 | 2/2010 | Dadheech et al. |
| 2010/0051897 | A1 | 3/2010 | Chen et al. |
| 2010/0051907 | A1 | 3/2010 | Pfeiffer |
| 2010/0051960 | A1 | 3/2010 | Chen et al. |
| 2010/0085713 | A1 | 4/2010 | Balandln et al. |
| 2010/0090759 | A1 | 4/2010 | Shin et al. |
| 2010/0108893 | A1 | 5/2010 | Flitsch et al. |
| 2010/0108981 | A1 | 5/2010 | Jayasekara |
| 2010/0108982 | A1 | 5/2010 | Ping et al. |
| 2010/0127243 | A1 | 5/2010 | Banerjee et al. |
| 2010/0163285 | A1 | 7/2010 | Marinero |
| 2010/0200840 | A1 | 8/2010 | Anderson et al. |
| 2011/0006425 | A1 | 1/2011 | Wada et al. |
| 2011/0254082 | A1 | 10/2011 | Jang |
| 2012/0080662 | A1 | 4/2012 | Saito et al. |
| 2012/0080796 | A1 | 4/2012 | Wada et al. |
| 2012/0086132 | A1 | 4/2012 | Kim et al. |
| 2013/0217226 | A1 | 8/2013 | Kitamura et al. |
| 2014/0061916 | A1 | 3/2014 | Saito et al. |
| 2014/0187033 | A1 | 7/2014 | Yamazaki et al. |
| 2016/0056256 | A1 | 2/2016 | Ishikura et al. |

FOREIGN PATENT DOCUMENTS

| | | |
|---|---|---|
| CN | 205110253 U | 3/2016 |
| CN | 205275791 U | 6/2016 |
| JP | 05-175359 A | 7/1993 |
| JP | 2005-060146 | 3/2005 |
| JP | 2006-120730 | 5/2006 |
| JP | 2009-164432 | 7/2009 |
| JP | 2009-277803 | 11/2009 |
| JP | 2010-135631 | 6/2010 |
| JP | 2011-023420 | 2/2011 |
| JP | 2011-096980 | 5/2011 |
| KR | 10-2007-0066426 | 6/2007 |
| TW | 200701258 | 3/2007 |
| TW | 2010001695 | 1/2010 |
| TW | 100122935 | 9/2013 |
| WO | WO 2006/133318 | 12/2006 |
| WO | WO 2009/060556 | 5/2009 |
| WO | WO 2009/140596 | 11/2009 |

OTHER PUBLICATIONS

WO PCT/US2011/039465 Search Rept., dated Feb. 9, 2012, Micron Technology, Inc.

WO PCT/US2011/039465 Writ. Opin., dated Feb. 9, 2012, Micron Technology, Inc.

Banerjee et al., "Depositing Graphene Films on Solid and Perforated Substrates", Nanotechnology 19, Jul. 25, 2008, United Kingdom, 5 pages.

Cao et al., "Electronic Transport in Chemical Vapor Deposited Graphene Synthesized on Cu: Quantum Hall Effect and Weak Localization", Applied Physics Letters 96, Mar. 24, 2010, United States, 3 pages.

Chen et al., "Printed Graphene Circuits", Advanced Materials 19, Oct. 5, 2007, United States, pp. 3623-3627.

Ismach et al., "Direct Chemical Vapor Deposition of Graphene on Dielectric Surfaces", NANO Letters 10, Apr. 2, 2010, United States, pp. 1542-1548.

* cited by examiner

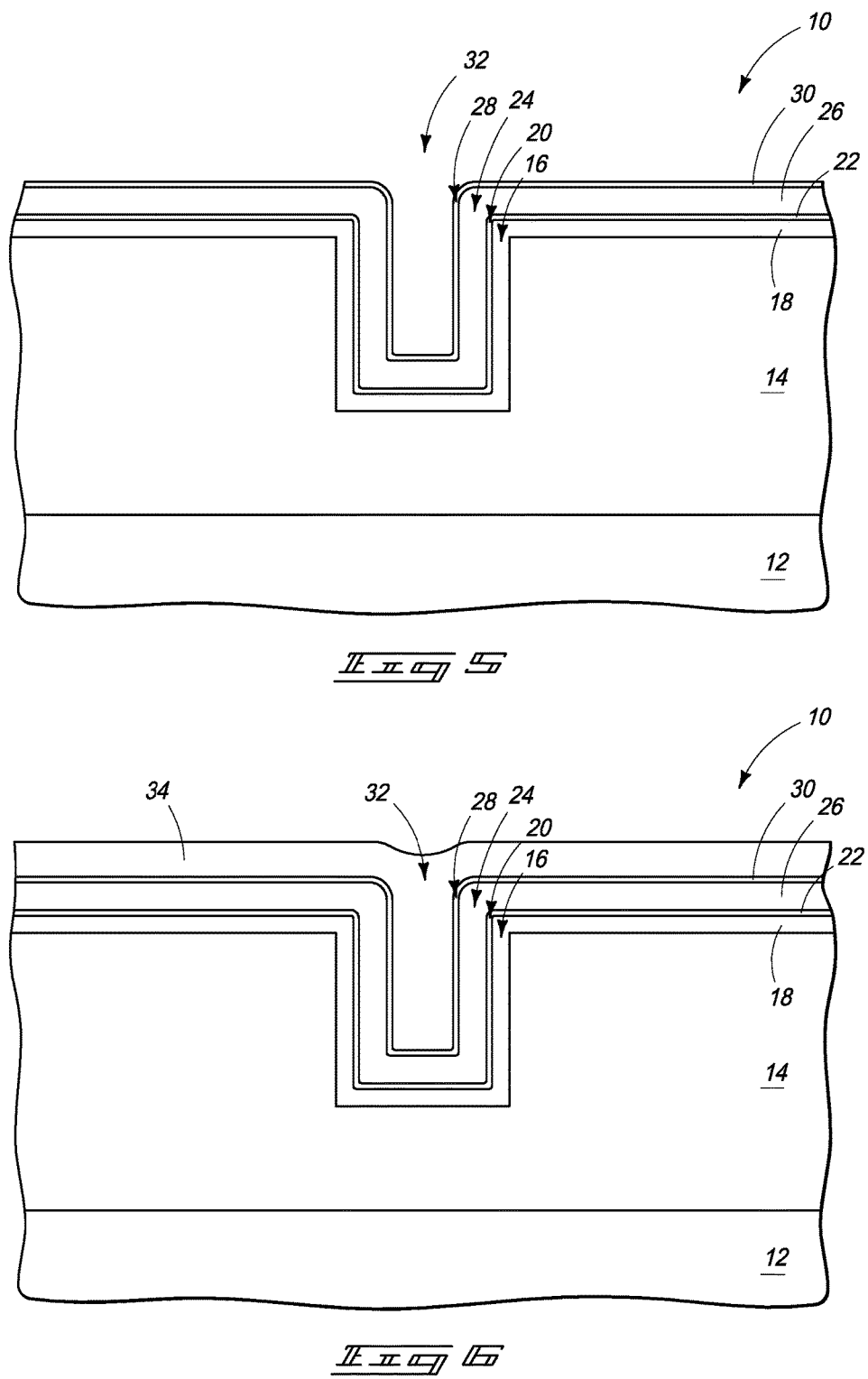

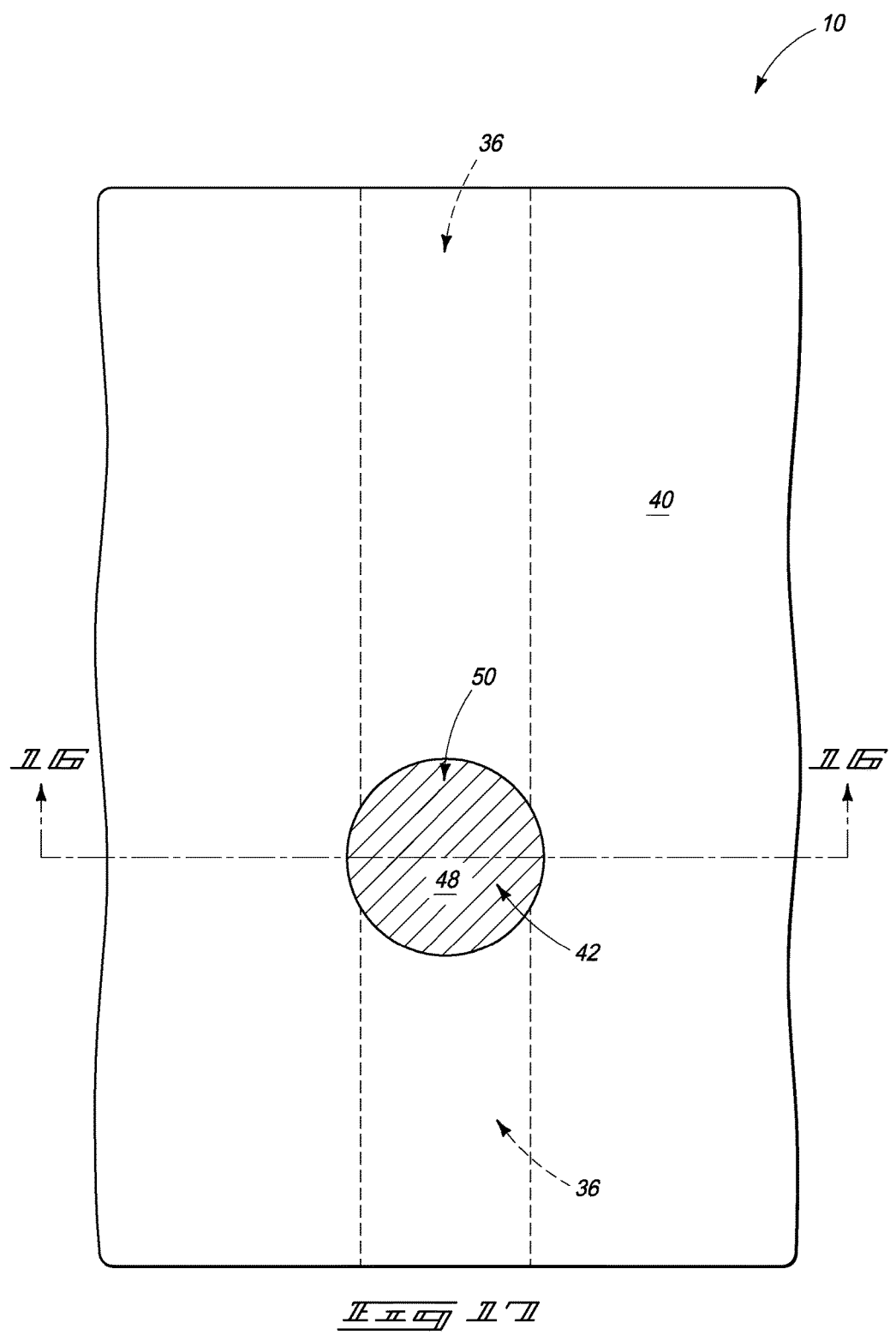

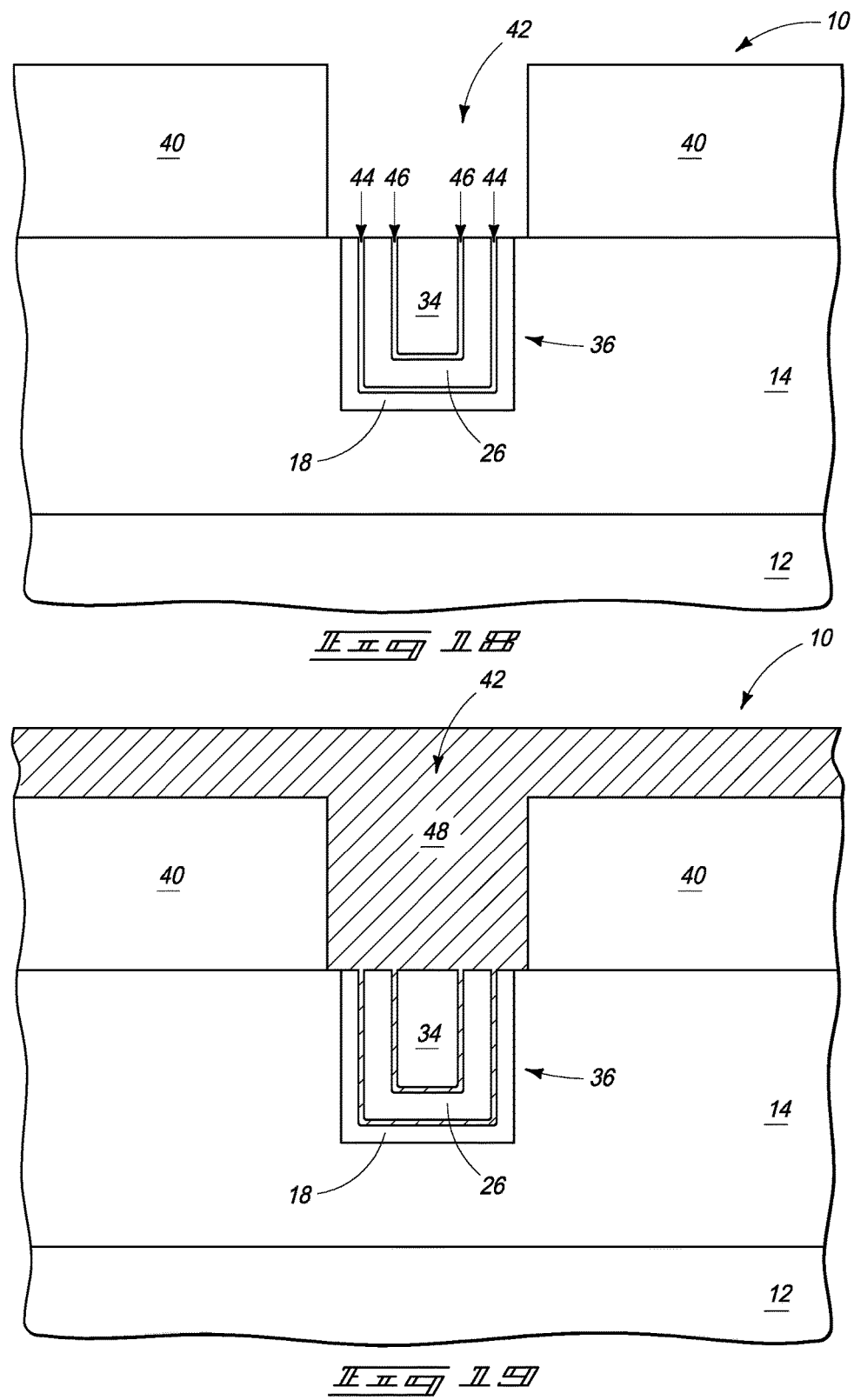

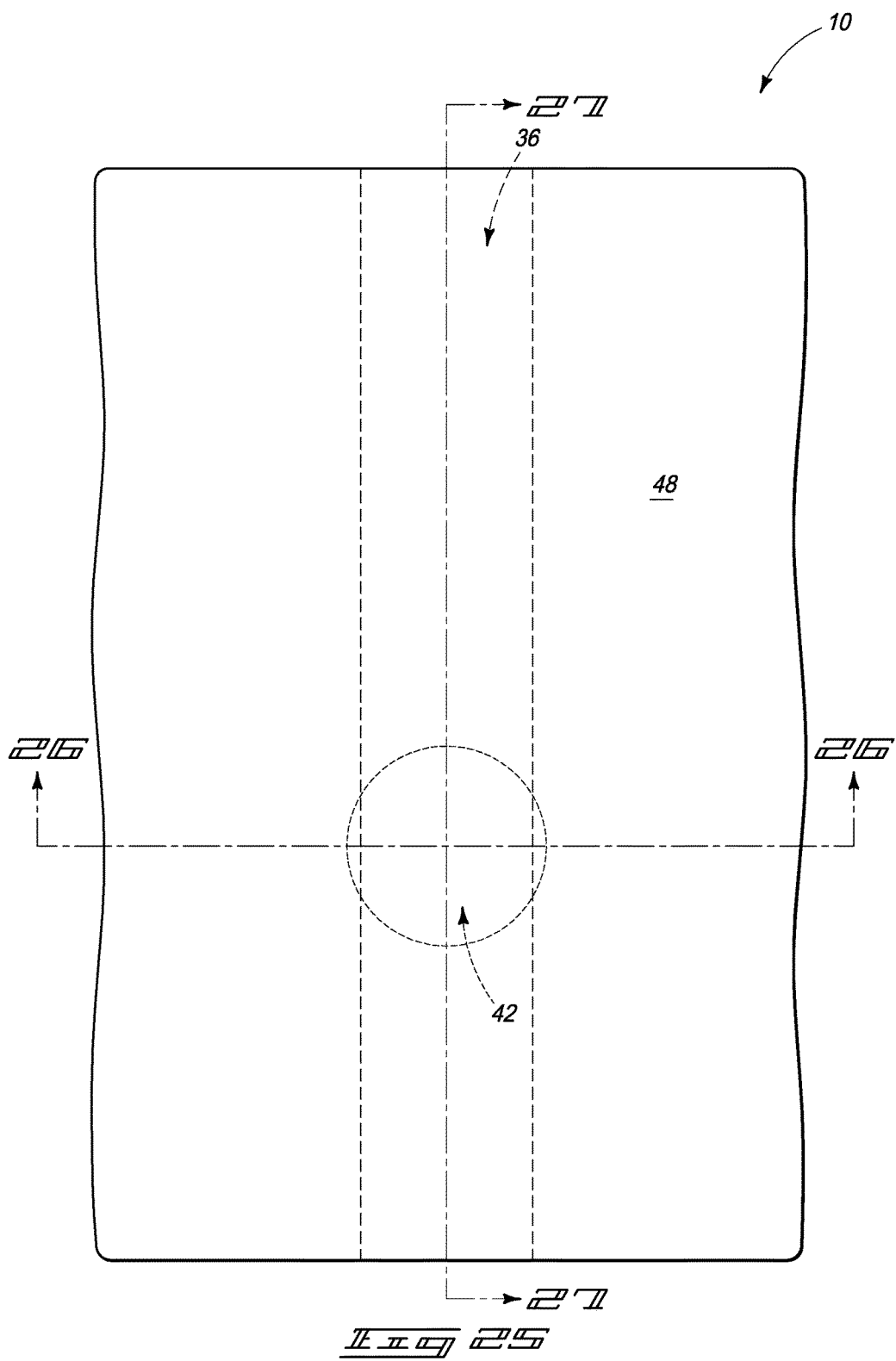

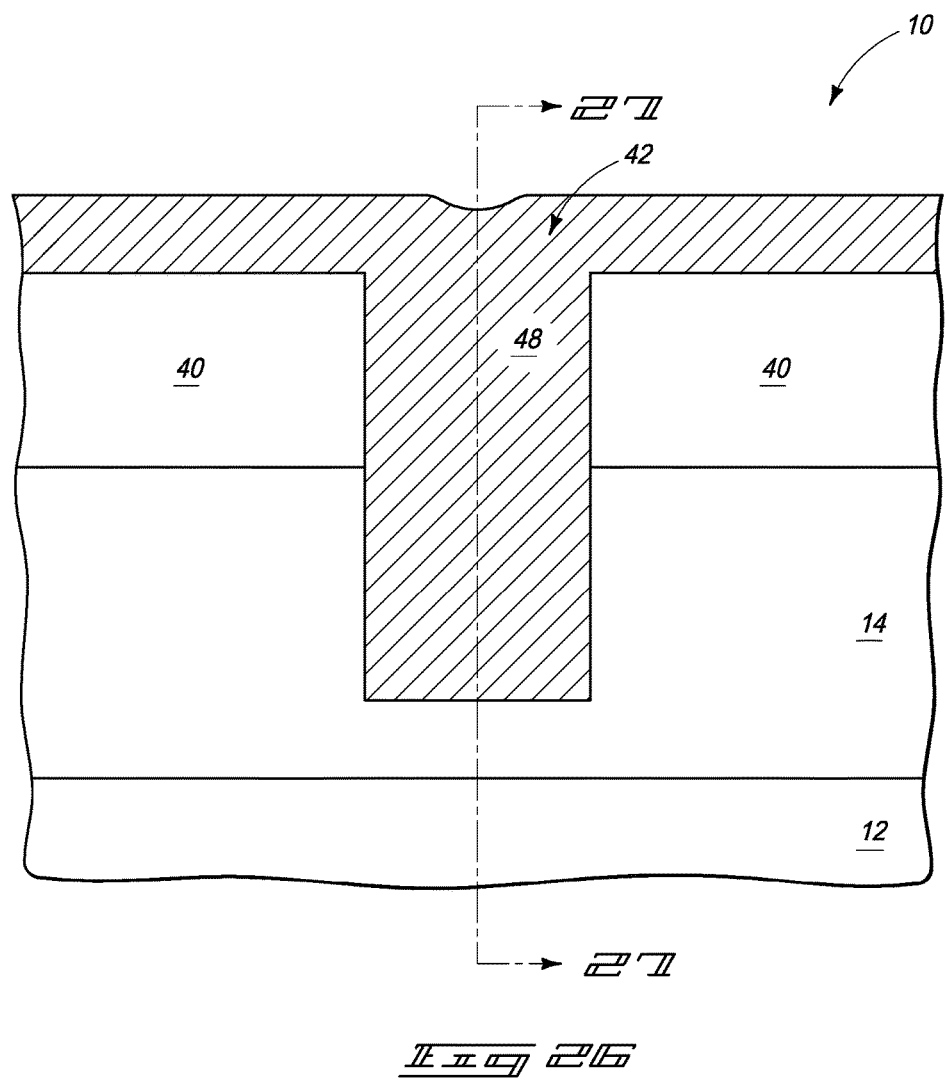

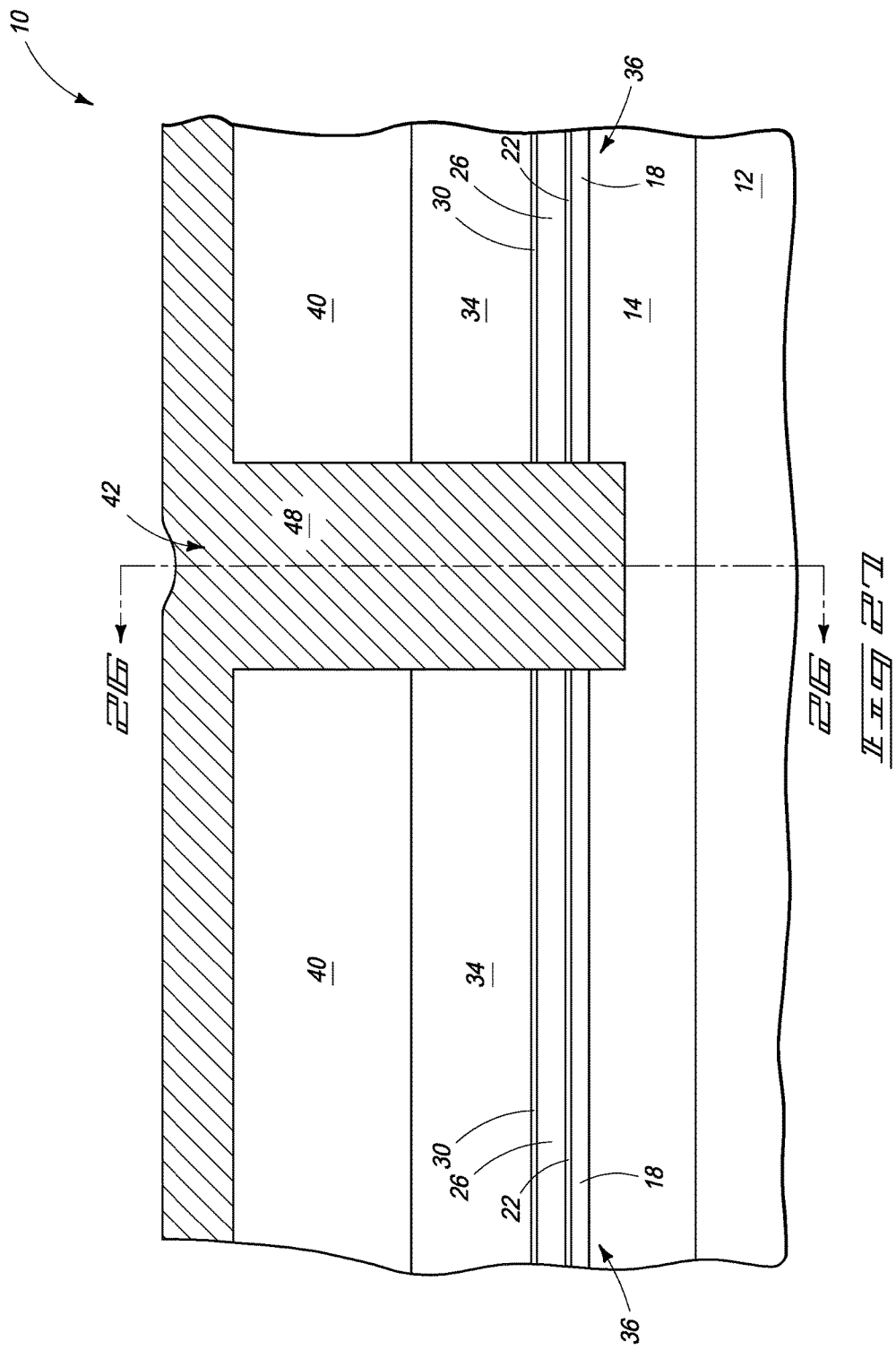

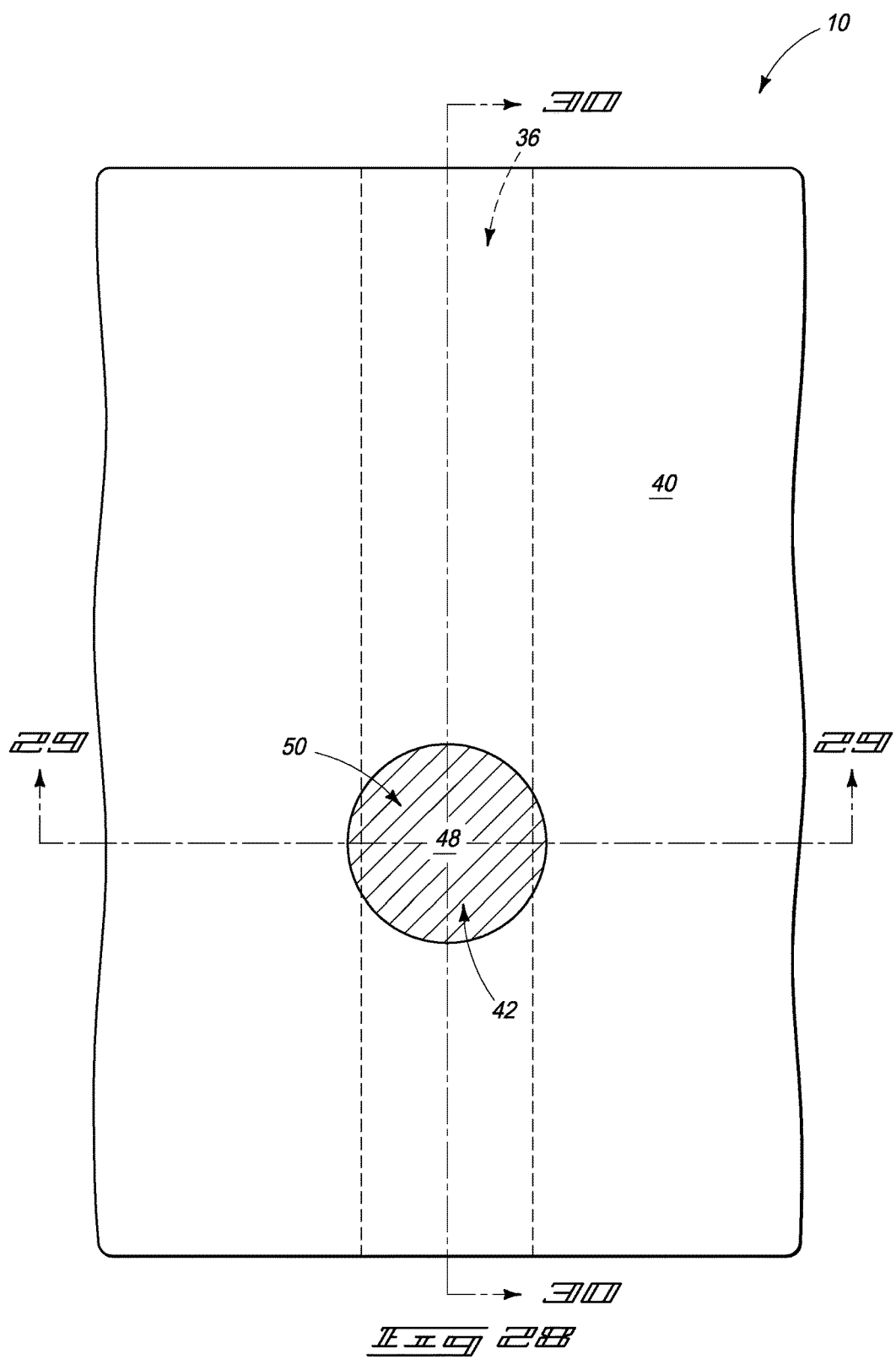

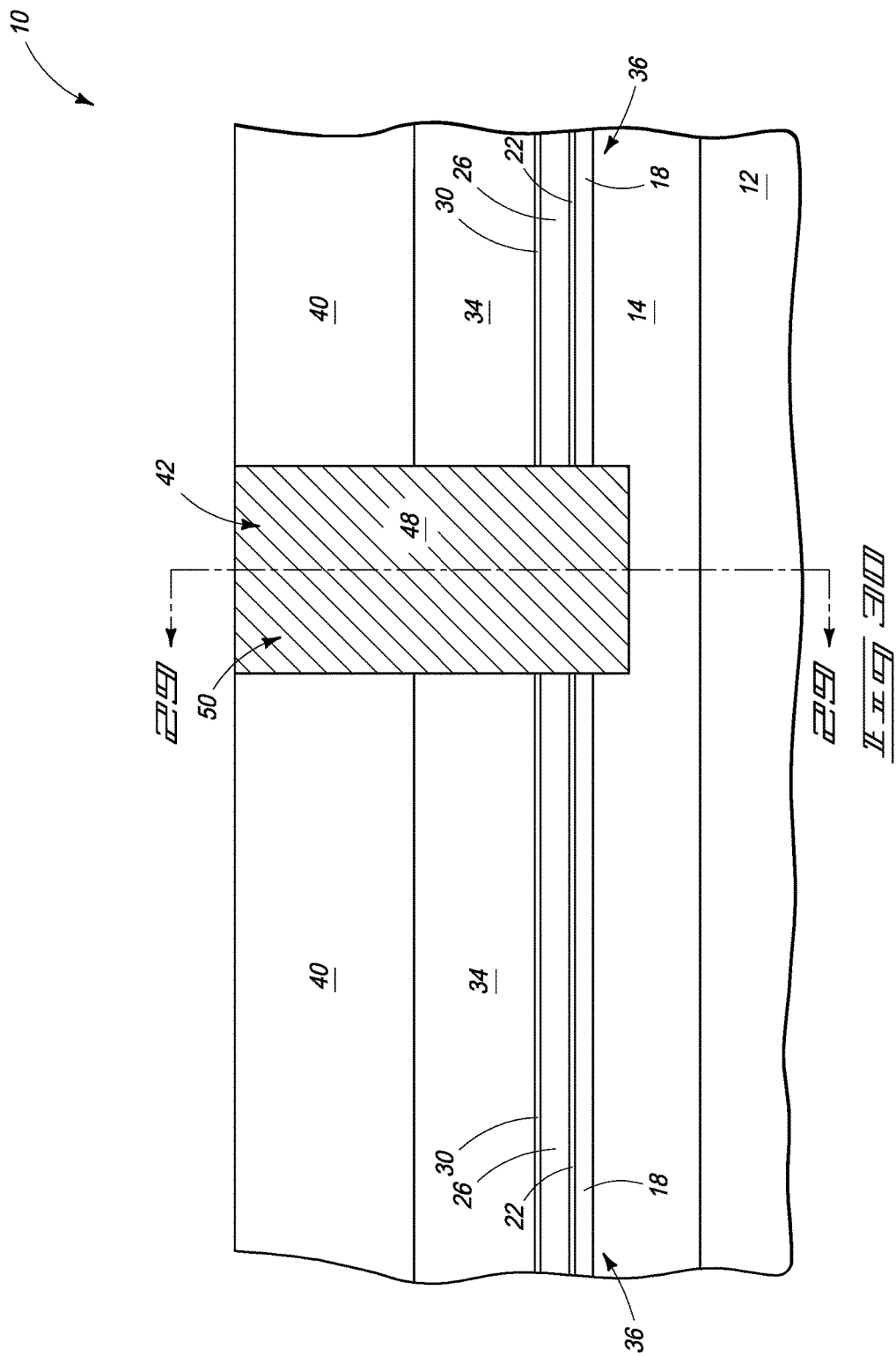

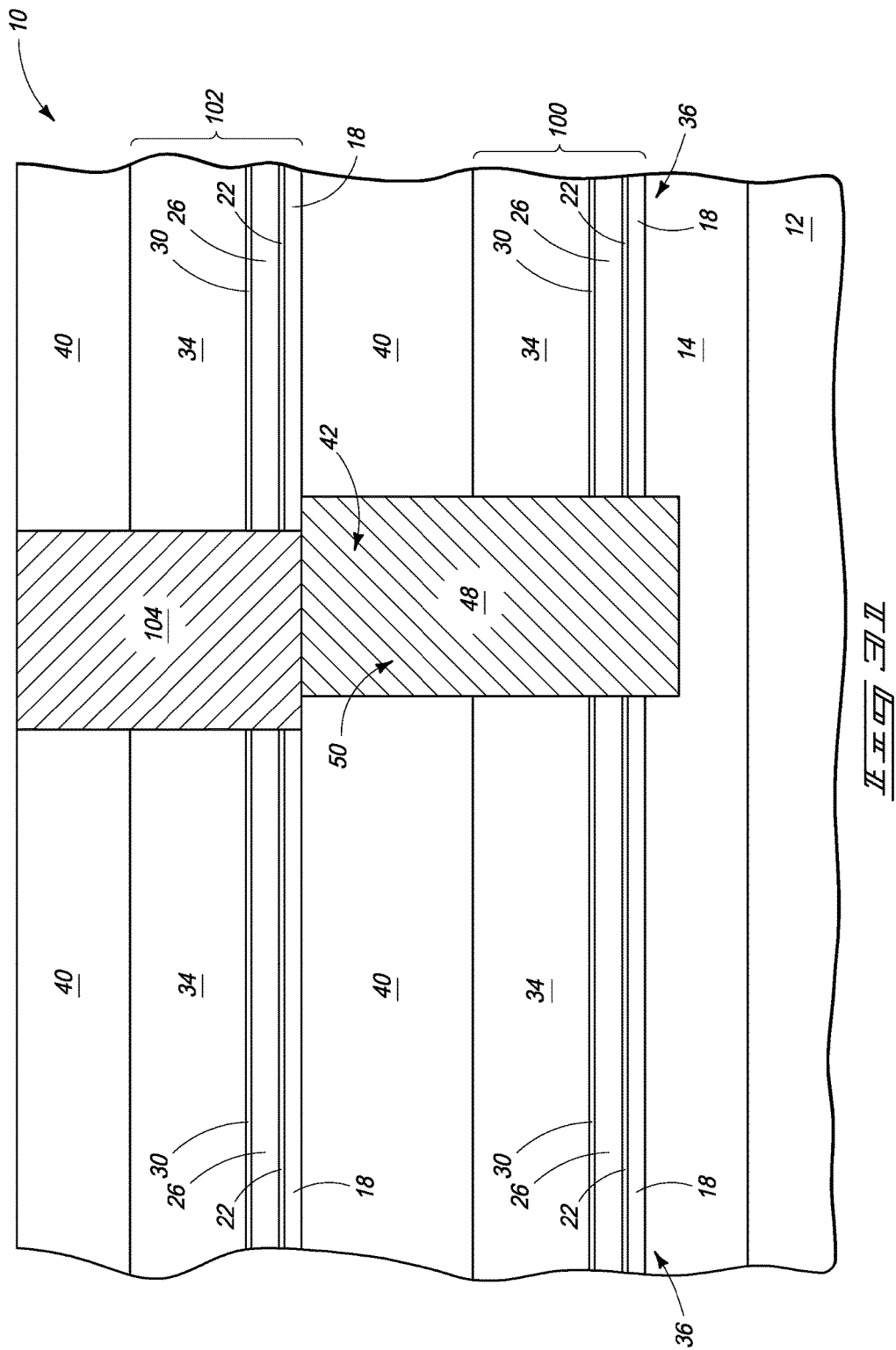

US 10,141,262 B2

ELECTRICALLY CONDUCTIVE LAMINATE STRUCTURES

RELATED PATENT DATA

This application is a divisional of and claims priority to U.S. Patent application Ser. No. 14/611,514, filed Feb. 2, 2015, titled "Electrically Conductive Laminate Structures", which is a divisional of and claims priority to U.S. patent application Ser. No. 12/833,074, filed Jul. 9, 2010, now U.S. Pat. No. 8,946,903, titled "Electrically Conductive Laminate Structures", the disclosures of which are incorporated herein by reference.

TECHNICAL FIELD

Electrically conductive laminate structures, electrical interconnects, and methods of forming electrical interconnects.

BACKGROUND

Electrical interconnects may be used for electrically interconnecting various components of integrated circuitry.

A continuing goal of integrated circuit fabrication is to increase the density of circuit devices. A related goal is to develop electrical interconnects that can sustain high current density within a relatively small physical dimension. Conventional processing utilizes one or more of conductively-doped semiconductor material (for instance, conductively-doped silicon, conductively-doped germanium, etc.), metallic materials (for instance, copper, aluminum, etc.) and metal-containing compositions (for instance, metal silicides, metal nitrides, etc.) for electrical interconnects.

As integrated circuitry is formed to ever higher density, it is becoming increasingly difficult to form satisfactory electrical interconnects with conventional materials. Accordingly, it is desired to develop new interconnect structures, and to develop methods for fabrication of such interconnect structures.

BRIEF DESCRIPTION OF THE DRAWINGS

FIGS. 1-7 are diagrammatic cross-sectional views of a portion of a semiconductor construction at various processing stages of an example embodiment.

FIGS. 16 and 17 are a diagrammatic cross-sectional view and a diagrammatic top view, respectively, of the semiconductor construction of FIGS. 1-7 shown at a processing stage subsequent to that of FIGS. 14 and 15. The cross-section of FIG. 16 is along the line 16-16 of FIG. 17.

FIGS. 18 and 19 are diagrammatic cross-sectional views of a portion of a semiconductor construction at various processing stages of another example embodiment. The processing stage of FIG. 18 follows that of FIGS. 10 and 11.

FIGS. 22-24 are a diagrammatic top view and a pair of cross-sectional side views of the semiconductor construction of FIGS. 20 and 21 at a processing stage subsequent to that of FIGS. 20 and 21. The cross-section of FIG. 23 is along the lines 23-23 of FIGS. 22 and 24; and the cross-section of FIG. 24 is along the lines 24-24 of FIGS. 22 and 23.

FIGS. 25-27 are a diagrammatic top view and a pair of cross-sectional side views of the semiconductor construction of FIGS. 22-24 at a processing stage subsequent to that of FIGS. 22-24. The cross-section of FIG. 26 is along the lines 26-26 of FIGS. 25 and 27; and the cross-section of FIG. 27 is along the lines 27-27 of FIGS. 25 and 26.

FIGS. 28-30 are a diagrammatic top view and a pair of cross-sectional side views of the semiconductor construction of FIGS. 22-24 at a processing stage subsequent to that of FIGS. 25-27. The cross-section of FIG. 29 is along the lines 29-29 of FIGS. 28 and 30; and the cross-section of FIG. 30 is along the lines 30-30 of FIGS. 28 and 29.

FIG. 31 shows a diagrammatic cross-sectional side view of the construction of FIGS. 28-30 at a processing stage subsequent to that of FIG. 30 in accordance with an example embodiment.

DETAILED DESCRIPTION OF THE ILLUSTRATED EMBODIMENTS

Some embodiments include electrically conductive laminate structures containing graphene. The graphene may be sandwiched between non-graphene materials. At least one of the non-graphene materials directly against the graphene may be a metallic material (such as a material comprising one or both of copper and nickel). A large surface area of the graphene is directly against the metallic material, which may enhance electron mobility between the metallic material and the graphene. The amount of surface area at the interfaces of the graphene and non-graphene materials may be enhanced by wrapping the graphene and non-graphene materials within a trench. In some embodiments an electrical contact is formed to the graphene-containing laminate structure. The contact may be formed by providing a conductive material in direct contact with an electrically-conductive non-graphene material of the laminate structure. In operation, the graphene of the laminate structure may conduct most of the current through the interconnect, and conductive non-graphene material of the laminate structure may be utilized for electrically connecting circuitry to the laminate structure. In some embodiments the laminate structures may be suitable to support ultra-high current densities.

Example embodiments are described with reference to FIGS. 1-30.

Figure 1:
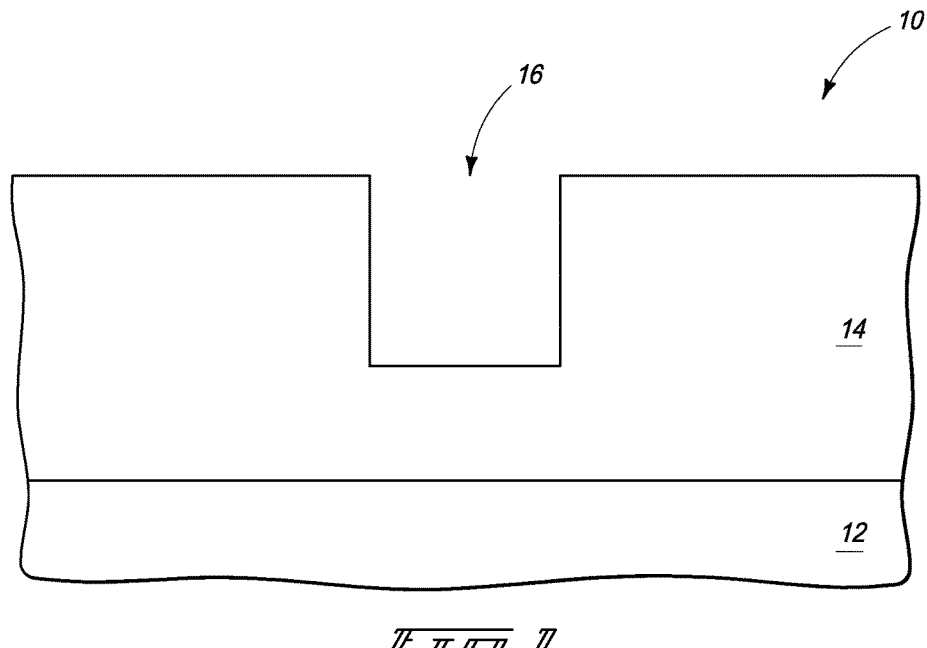

Referring to FIG. 1, a semiconductor construction 10 is illustrated at a processing stage of an example embodiment.

The semiconductor construction comprises a base 12, and an electrically insulative material 14 over the base.

Base 12 may comprise, consist essentially of, or consist of monocrystalline silicon, and may be referred to as a semiconductor substrate, or as a portion of a semiconductor substrate. The terms "semiconductive substrate," "semiconductor construction" and "semiconductor substrate" mean any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductive substrates described above. Although base 12 is shown to be homogenous, the base may comprise numerous layers in some embodiments. For instance, base 12 may correspond to a semiconductor substrate containing one or more layers associated with integrated circuit fabrication. In such embodiments, such layers may correspond to one or more of refractory metal layers, barrier layers, diffusion layers, insulator layers, etc.

Material 14 may comprise any suitable electrically insulative composition, such as, for example, one or more of silicon dioxide, silicon nitride, borophosphosilicate glass (BPSG), fluorosilicate glass (FSG), phosphosilicate glass (PSG), etc. Although material 14 is shown to be homogeneous, material 14 may comprise numerous layers in some embodiments.

A trench 16 extends into material 14. Trench 16 may be formed with any suitable processing. For instance, the trench may be formed by providing a photolithographically-patterned mask (not shown) over material 14 to define a location of the trench, etching into material 14 with one or more suitable etches, and then removing the mask to leave the shown construction of FIG. 1.

Figure 2:
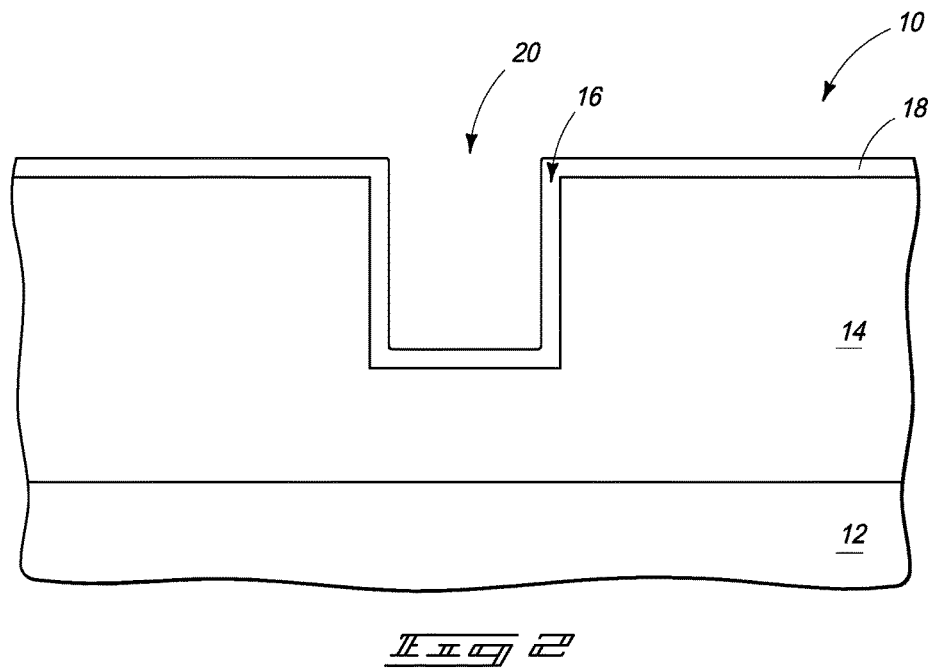

Referring to FIG. 2, a material 18 is formed across insulative material 14. The material 18 lines trench 16, and thus forms a second trench 20 within the trench 16. Material 18 may be a non-graphene material (in other words, a material that does not comprise graphene). In some embodiments material 18 may comprise an electrically conductive material suitable for subsequent formation of graphene thereon, and in some embodiments may comprise metallic material. For instance, material 18 may comprise, consist essentially of, or consist of one or both of copper and nickel; and may therefore be suitable for subsequent chemical vapor deposition of graphene thereon. In some embodiments material 18 may comprise electrically insulative material suitable for subsequent formation of graphene thereon. In some embodiments material 18 may comprise silicon carbide.

Figure 3:
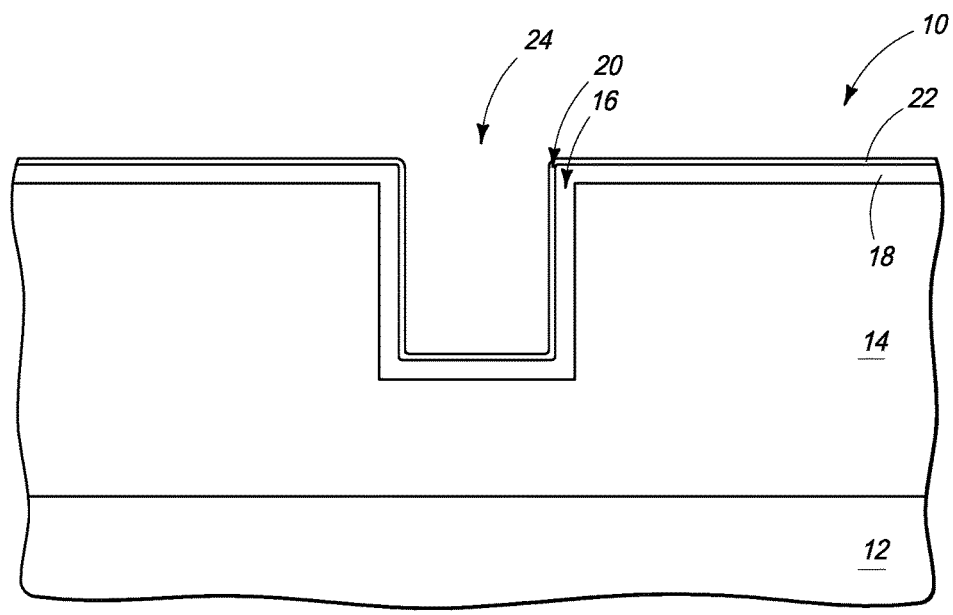

Referring to FIG. 3, graphene 22 is formed over non-graphene material 18. Graphene 22 lines trench 20, and thus forms a third trench 24 within the second trench 20.

Graphene 22 may be formed by any suitable method. For instance, the graphene may be formed by chemical vapor deposition and/or atomic layer deposition over a metallic non-graphene material 18. As another example, the graphene may be formed from a silicon carbide material 18, such as by sublimation of Si from SiC.

The graphene is at least one monolayer thick, and preferably no more than 10 monolayers thick. In some embodiments the graphene may be less than or equal to about 5 monolayers thick, and may be, for example, from about one monolayer thick to about 5 monolayers thick. In some example applications the graphene 22 may be about three monolayers thick. It is desired that the graphene be thin enough to achieve desired high conductivity. In some embodiments, the graphene may be able to sustain a current density that is from about 10-fold to about 100-fold greater than that of copper.

Figure 4:
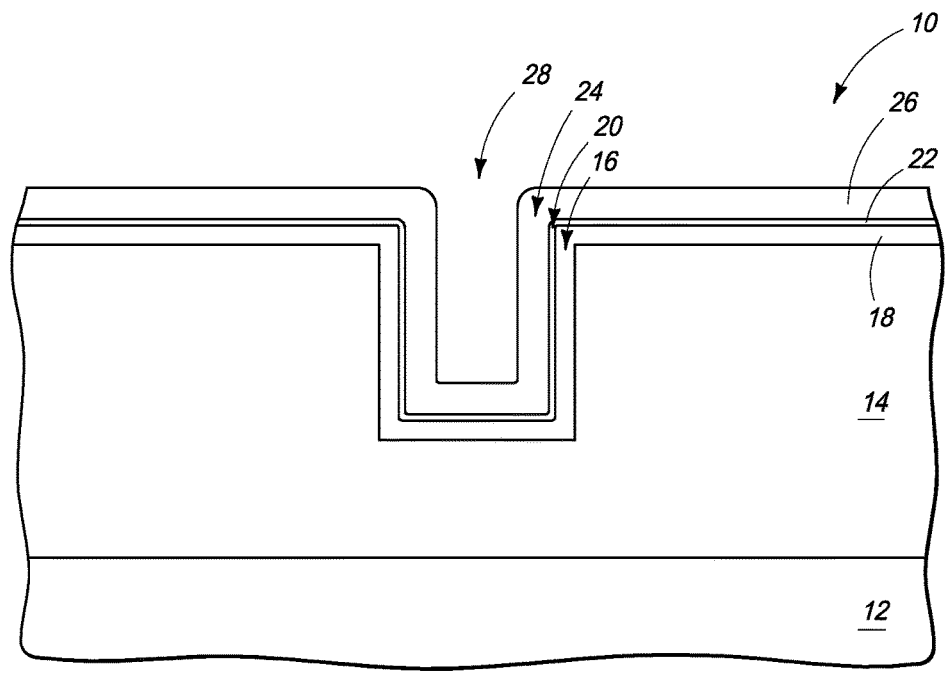

Referring to FIG. 4, a non-graphene material 26 is formed over graphene material 22. The non-graphene material 26 lines trench 24, and thus forms a fourth trench 28 within the third trench 24. The non-graphene material 26 may be referred to as a second non-graphene material to distinguish it from the first non-graphene material 18. In some embodiments the materials 18 and 26 may comprise the same composition as one another, and in other embodiments the materials 18 and 26 may comprise different compositions from one another. In some embodiments at least one of the materials 18 and 26 is electrically conductive and the other is electrically insulative. For instance, material 18 may comprise a metallic material suitable for formation of graphene 22 thereon, and material 26 may comprise an electrically insulative material such as silicon dioxide, silicon nitride, etc. In some embodiments both of the non-graphene materials 18 and 26 are electrically conductive.

Referring to FIG. 5, graphene 30 is formed over non-graphene material 26. Graphene 30 lines the fourth trench 28, and thus forms a fifth trench 32 within the fourth trench.

Figure 6H:
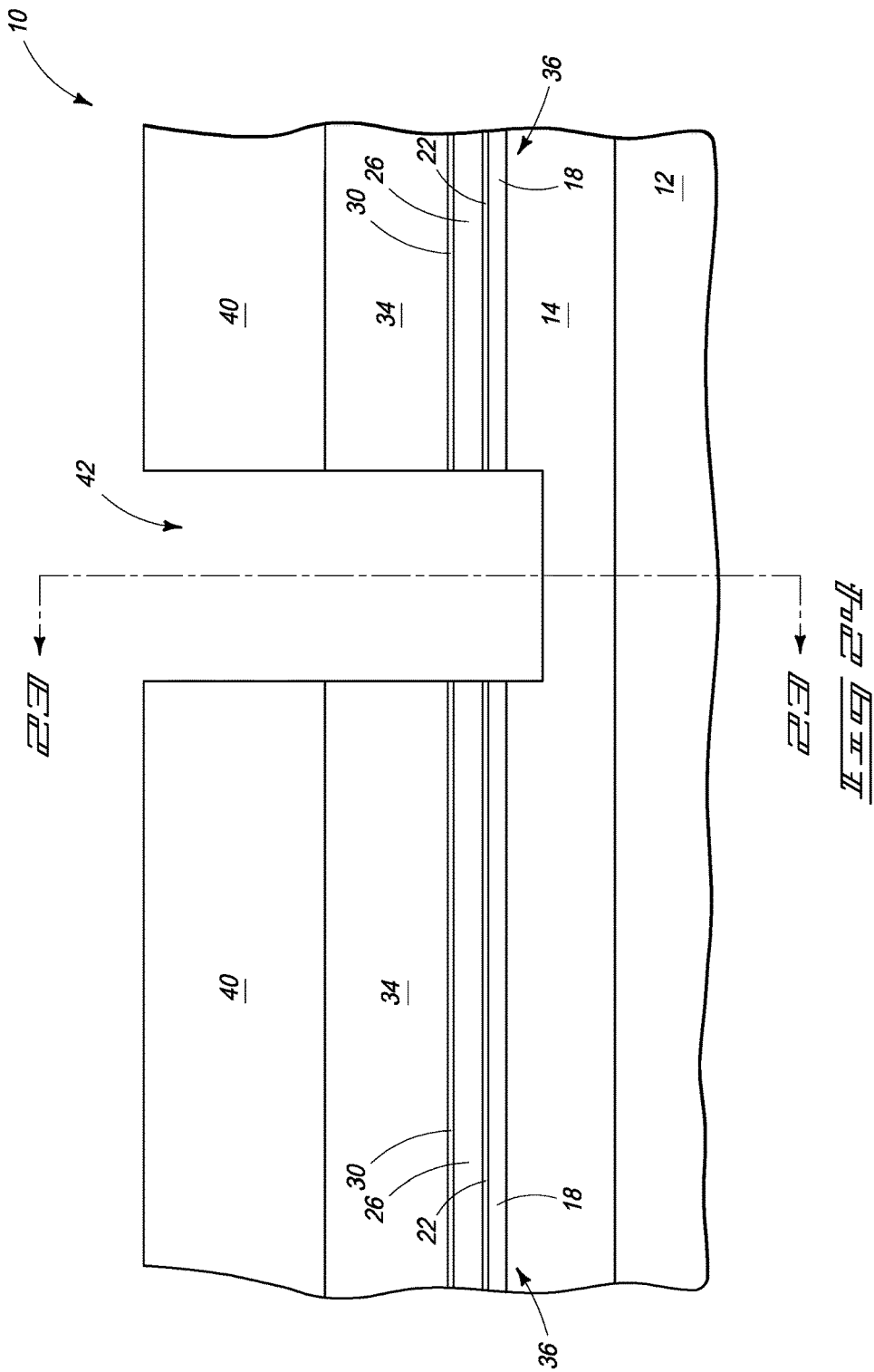

Referring to FIG. 6, a non-graphene material 34 is formed over graphene material 30. The non-graphene material 34 fills the trench 32 in the shown embodiment. In other embodiments the non-graphene material 34 may only partially fill the trench, and the stacking of graphene and non-graphene materials within the trench may continue to form more than the shown number of discrete materials within the trench. In some embodiments there may be less than the shown number of alternating materials within the initial trench 16 (FIG. 1). Specifically, although the non-graphene material 26 only partially fills trench 24 at the processing stage of FIG. 4, in other embodiments the non-graphene material 26 may completely fill the trench so that it is only materials 18, 22 and 26 within the initial trench 16.

The non-graphene material 34 of FIG. 6 may be referred to as a third non-graphene material. In some embodiments the non-graphene materials 18, 26 and 34 may all have the same composition as one another, and in other embodiments at least one of the non-graphene materials may have a different composition than at least one of the others of the non-graphene materials. In some embodiments all of the non-graphene materials may be electrically conductive, and in other embodiments at least one of the non-graphene materials may be electrically insulative.

Figure 7:
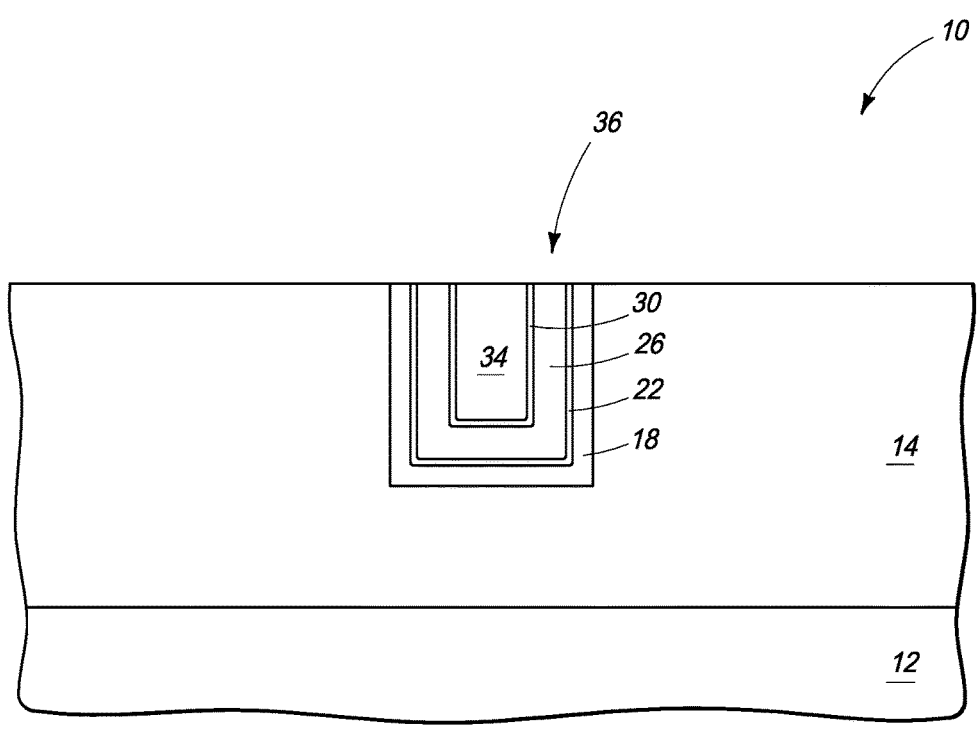

Referring to FIG. 7, construction 10 is subjected to planarization (for instance, chemical mechanical polishing) to remove materials 18, 22, 26, 30 and 34 from over a surface of electrically insulative material 14. The materials 18, 22, 26, 30 and 34 remaining within the initial trench 16 (FIG. 1) together form an electrically conductive interconnect 36. Graphene materials 22 and 30 can provide electrical conductivity through interconnect 36 regardless of whether one or more of the non-graphene materials 18, 26 and 32 is electrically insulative. Further, any of the non-graphene materials 18, 26 and 34 that is electrically conductive also provides electrical conductivity within interconnect 36. However, the high current density of graphene relative to other materials may cause the graphene to carry most of the current that is passed through the interconnect.

The interconnect 36 may be considered to comprise graphene regions (specifically, the regions containing graphene 22 and graphene 30), and non-graphene regions (specifically, the regions containing non-graphene materials 18, 26 and 34). The interconnect 36 may be considered to be a laminate structure comprising alternating graphene regions and non-graphene regions.

In the shown embodiment the graphene regions and non-graphene regions are nested within one another due to the graphene regions and non-graphene regions wrapping along the sidewalls of the various nested trenches 16, 20, 24, 28 and 32 (FIG. 6). In other embodiments the graphene regions and non-graphene regions may be planar. However, the nesting arrangement of the graphene and non-graphene regions of FIG. 7 can provide a large amount of surface interface between a graphene region and the immediately adjacent non-graphene region which can enhance electron mobility between the graphene region and the immediately adjacent non-graphene region. It may be difficult for electrons to pass from a non-graphene material to graphene, and vice versa, and thus large surface interfaces between the graphene and non-graphene materials may be advantageous to enable electrons to pass between the various structures of the interconnect 36.

In the embodiment of FIG. 7 each graphene region is sandwiched between a pair of non-graphene regions. In other embodiments at least one of the graphene regions may be at an outer edge of the interconnect so that such graphene region is against only one non-graphene region, rather than being sandwiched between a pair of non-graphene regions.

Figure 8:
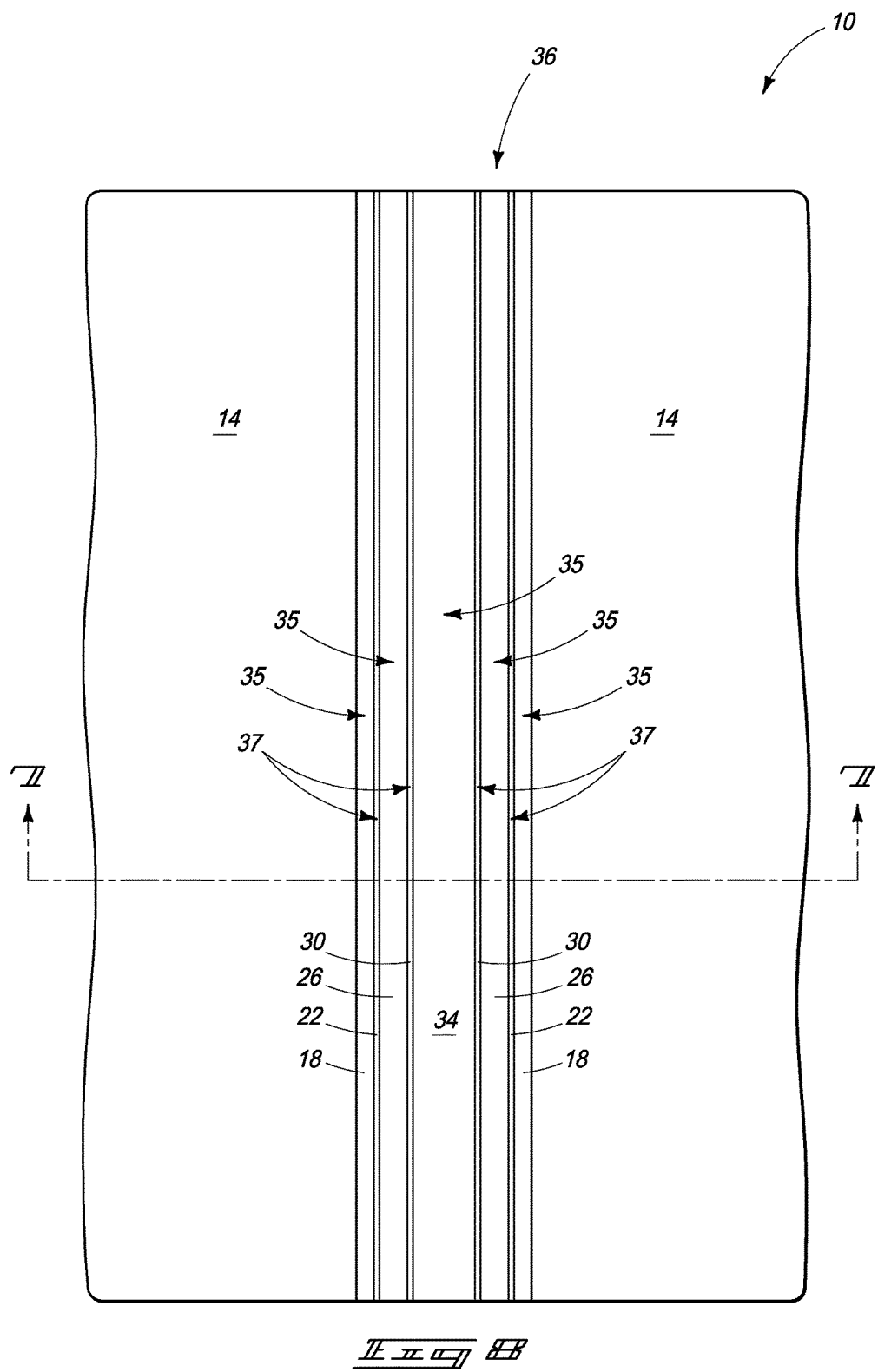
FIG. 8 is a diagrammatic top view of the semiconductor construction of FIG. 7. The cross-section of FIG. 7 is along the line 7-7 of FIG. 8.

FIG. 8 shows a top view of the construction of FIG. 7, and shows that the interconnect 36 is configured as a line. In other embodiments, the interconnect 36 may be configured to have a shape other than the linear shape of FIG. 8.

The top view of FIG. 8 shows that the interconnect 36 has an upper surface containing exposed segments 35 of the non-graphene regions, and exposed segments 37 of the graphene regions.

It can be difficult to form electrical contact to the interconnect 36, in that it can be difficult to establish electrical connection between the graphene regions and adjacent electrically conductive materials. Some embodiments include recognition that it can be advantageous to form electrical contact to the non-graphene electrically conductive materials of interconnect 36, and to then let electrons transfer from such electrically conductive materials to graphene of the interconnect for subsequent transport of electrons along the interconnect.

An example method of forming electrical contact to interconnect 36 is described with reference to FIGS. 9-17.

Figure 9:
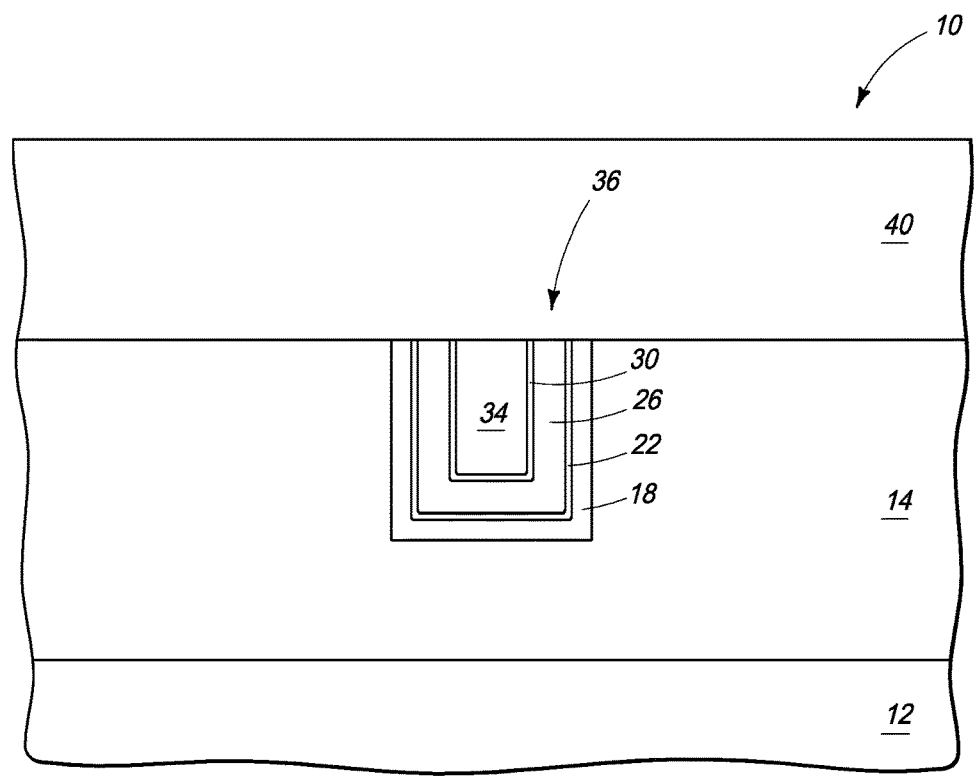
FIG. 9 is a diagrammatic cross-sectional view of the semiconductor construction of FIGS. 1-7 shown at a processing stage subsequent to that of FIGS. 7 and 8.

Referring to FIG. 9, an electrically insulative material 40 is formed over the upper surface of interconnect 36 and over insulative material 14. Material 40 may comprise any suitable composition or combination of compositions, such as, for example, one or more of silicon dioxide, silicon nitride, BPSG, PSG, FSG, etc.

Figure 10:
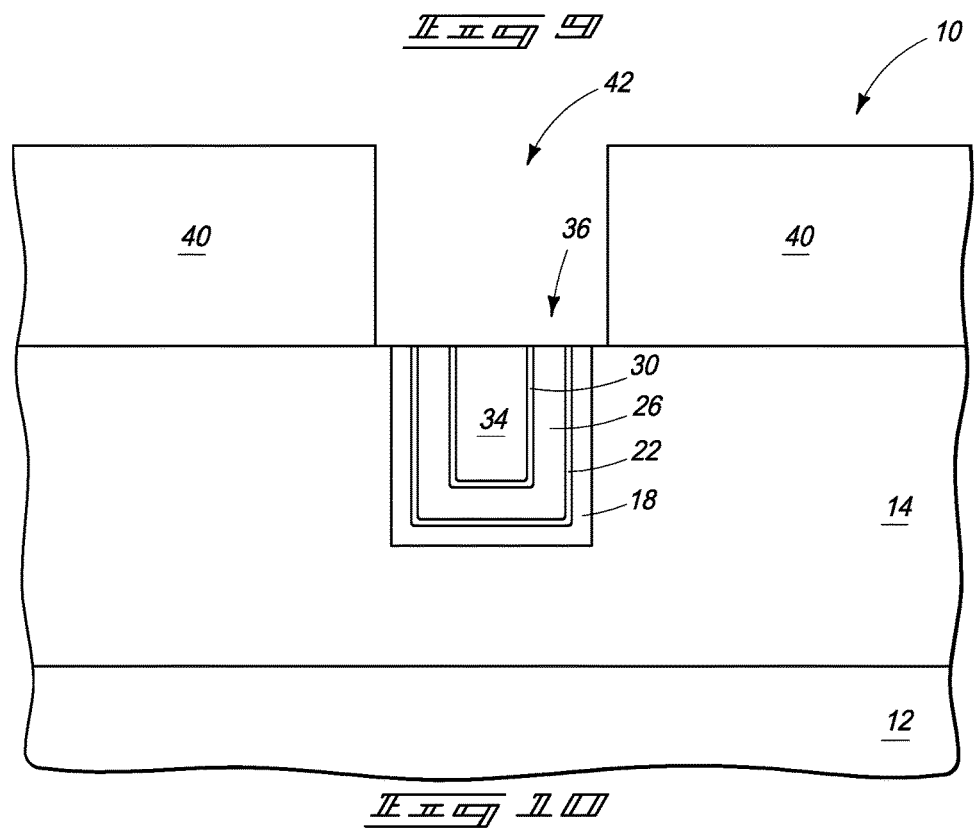
FIGS. 10 and 11 are a diagrammatic cross-sectional view and a diagrammatic top view, respectively, of the semiconductor construction of FIGS. 1-7 shown at a processing stage subsequent to that of FIG. 9. The cross-section of FIG. 10 is along the line 10-10 of FIG. 11.

Referring to FIG. 10, a contact opening 42 is etched through material 40 to expose an upper surface of interconnect 36. Opening 42 may be formed by any suitable methodology. For instance, a patterned photoresist mask (not shown) may be provided over material 40 to define a location of opening 42, the opening formed with one or more suitable etches, and then the mask removed to leave the construction shown in FIG. 10.

Figure 11:
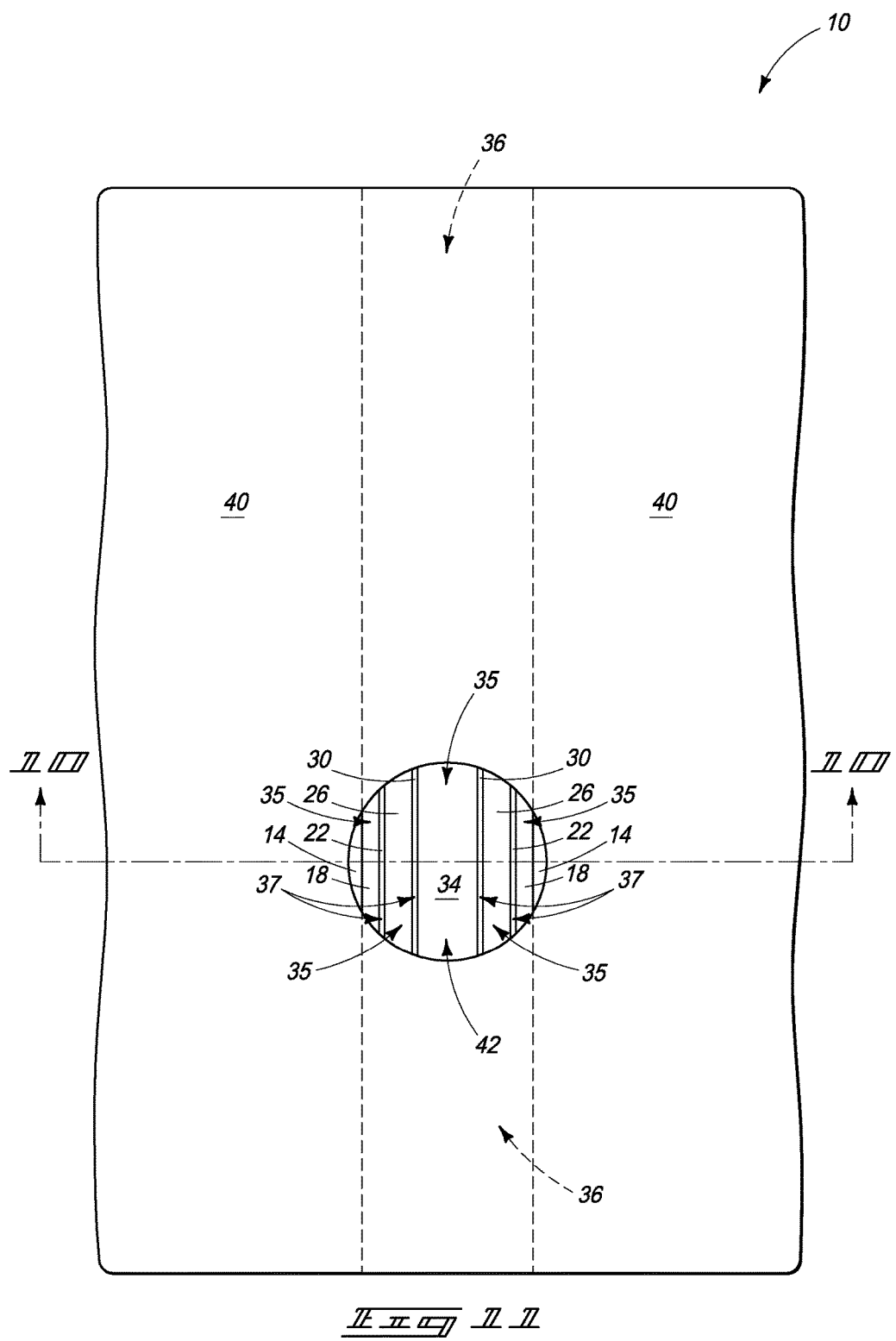

FIG. 11 shows a top view of the construction of FIG. 10, and shows contact opening 42 extending through material 40 to expose graphene-containing segments 37 and non-graphene-containing segments 35 of interconnect 36. Portions of the interconnect 36 that extend outwardly of contact opening 42 are shown in dashed-line view to indicate that such portions are beneath material 40.

Figure 12:
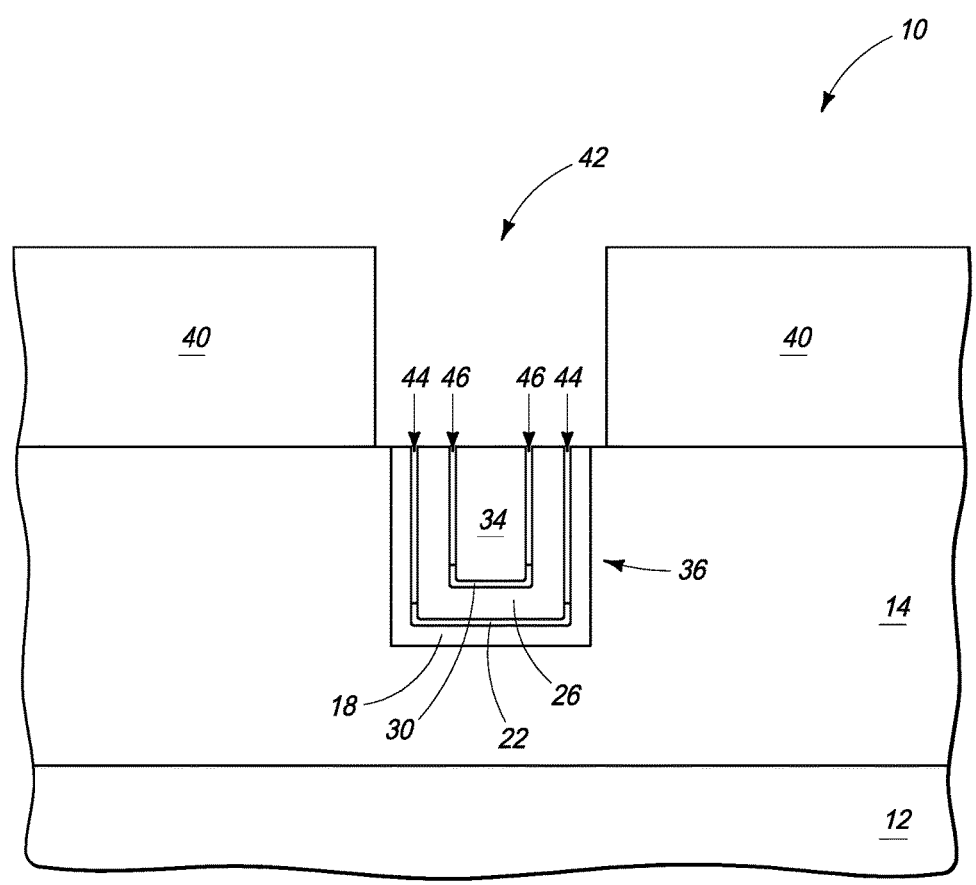
FIGS. 12 and 13 are a diagrammatic cross-sectional view and a diagrammatic top view, respectively, of the semiconductor construction of FIGS. 1-7 shown at a processing stage subsequent to that of FIGS. 10 and 11. The cross-section of FIG. 12 is along the line 12-12 of FIG. 13.
Figure 13:
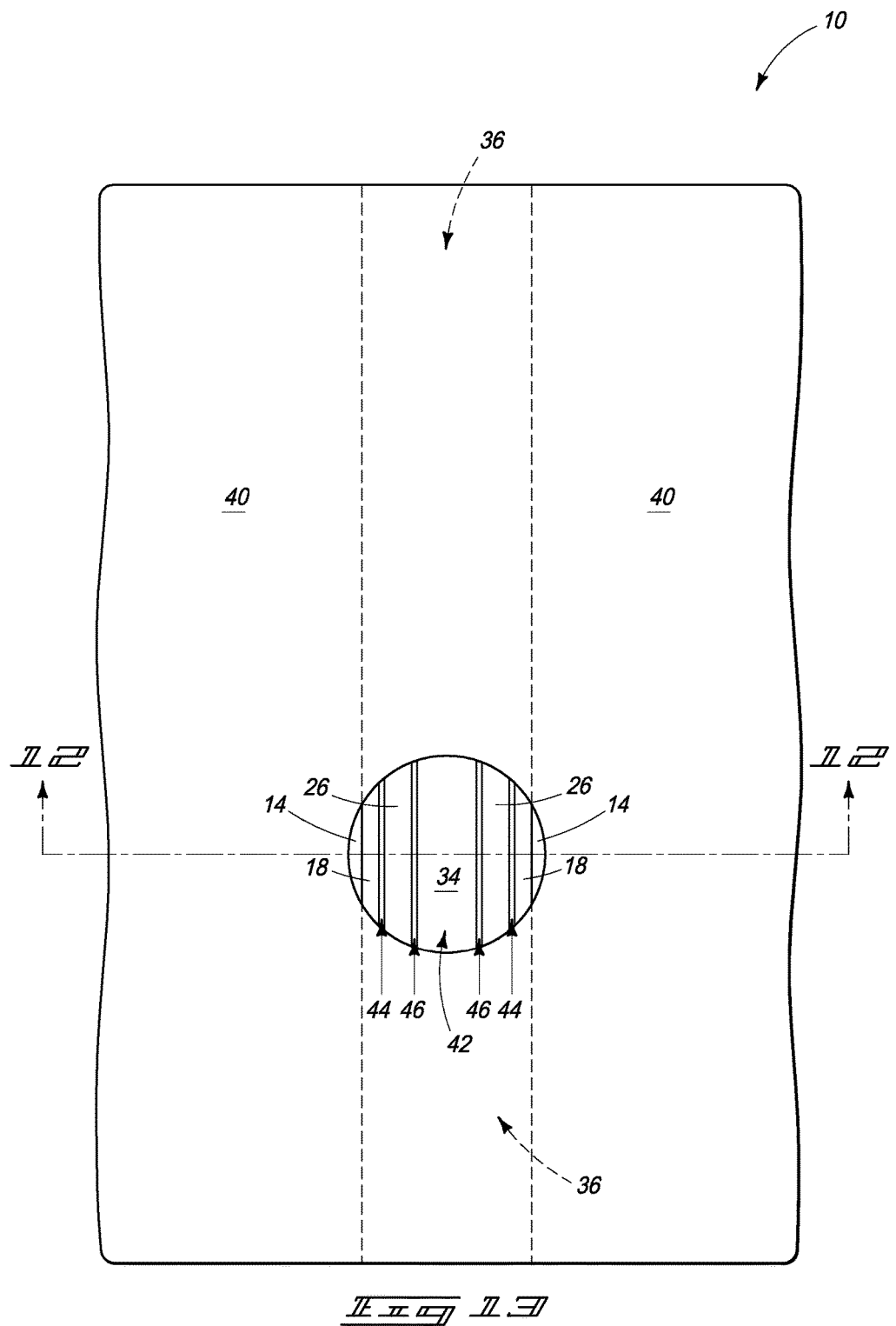

Referring to FIGS. 12 and 13, an etch is utilized to remove at least portions of the graphene-containing regions from within contact opening 42 to form spaces 44 and 46. The etch may utilize any suitable chemistry, and may, for example, utilize an oxidative plasma to ash the graphene. The etch may be selective for graphene-containing regions relative to non-graphene regions, as shown.

In the shown embodiment only some of the graphene-containing regions exposed within contact opening 42 are removed, and thus portions of graphene 22 and graphene 30 remain visible in the cross-section of FIG. 12.

In other embodiments the entirety of the exposed graphene regions may be removed, as discussed below with reference to FIGS. 18 and 19. In some embodiments a non-graphene region that is nested within a graphene region may be considered to be an inner non-graphene region, and the spaces formed by removal of the graphene region may be considered to extend at least partially around such inner non-graphene region. In some embodiments, one or more of the non-graphene materials (for instance, one or more of the materials 18, 26 and 34 in the shown embodiment of FIG. 12) may be etched to widen one or both of the openings 44 and 46.

The presence of spaces 44 and 46 changes the portion of interconnect 36 that is beneath contact opening 42 relative to other portions of the interconnect. Specifically, the portion of the interconnect beneath contact opening 42 has spaces 44 and 46 between non-graphene regions, whereas other portions of the interconnect have graphene between such non-graphene regions.

Figure 14:
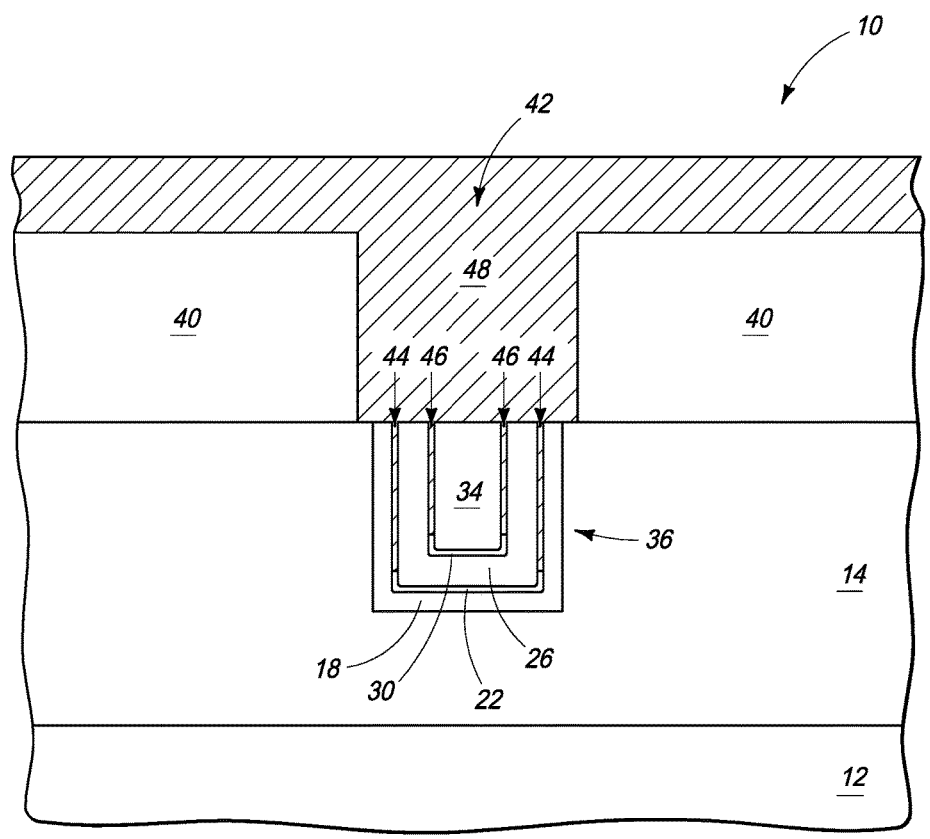
FIGS. 14 and 15 are a diagrammatic cross-sectional view and a diagrammatic top view, respectively, of the semiconductor construction of FIGS. 1-7 shown at a processing stage subsequent to that of FIGS. 12 and 13. The cross-section of FIG. 14 is along the line 14-14 of FIG. 15.
Figure 15:
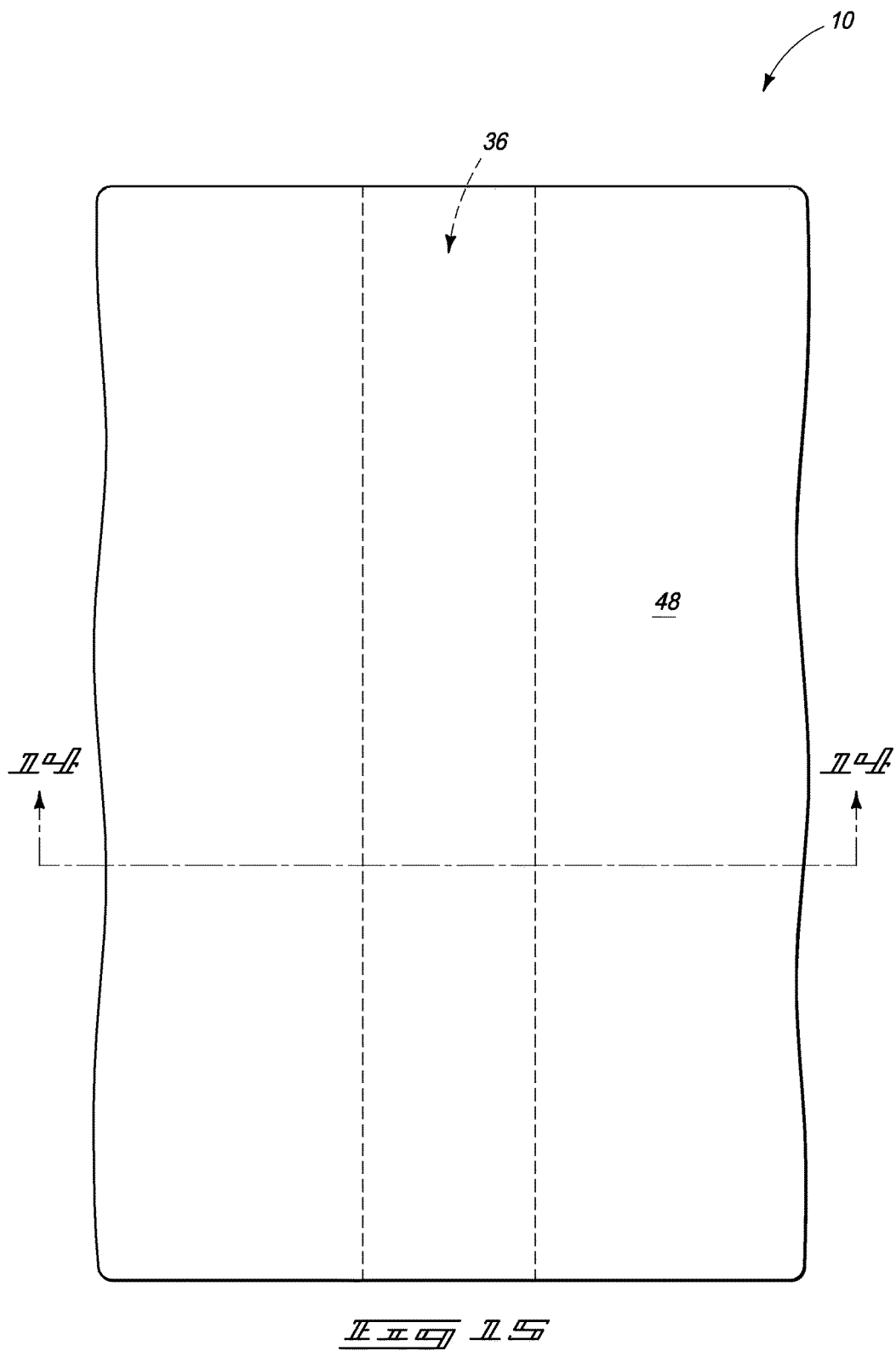

Referring to FIGS. 14 and 15, electrically conductive material 48 is provided within opening 42 and across insulative material 40. The electrically conductive material 48 may comprise any suitable composition or combination of compositions, and in some embodiments may comprise, consist essentially of, or consist of one or more of various metals (e.g., copper, aluminum, tungsten, titanium, etc.), metal-containing compositions (e.g., metal silicide, metal nitride, metal carbide, etc.) and conductively-doped semiconductor materials (e.g., conductively-doped silicon, conductively doped germanium, etc.).

The conductive material 48 extends within spaces 44 and 46, and thus extends partially around non-graphene materials 26 and 34 in the shown embodiment.

Figure 16:
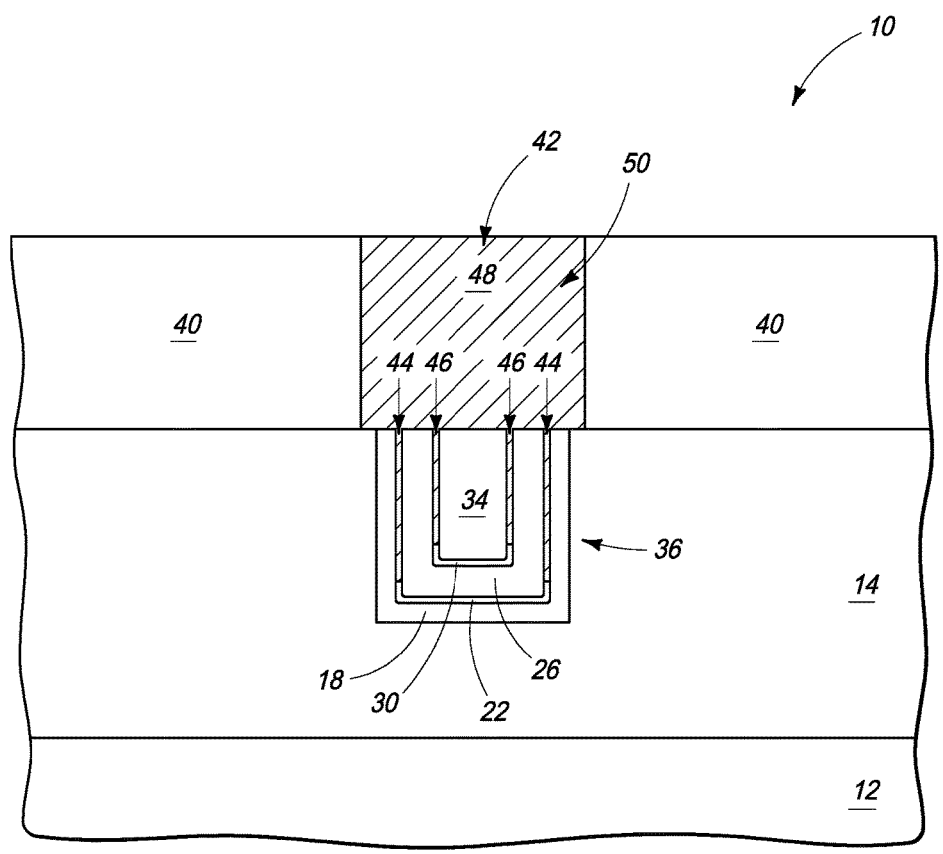

Referring to FIGS. 16 and 17, construction 10 is exposed to planarization (for instance, chemical mechanical polishing) to remove electrically conductive material 48 from over insulative material 40, while leaving the electrically conductive material within contact opening 42. The electrically conductive material 48 within the contact opening 42 defines an electrical contact 50. The electrical contact has conductive material extending within spaces 44 and 46, and partially around non-graphene regions 26 and 34.

In embodiments in which one or both of the non-graphene regions 26 and 34 comprises metal or other electrically conductive material, the extension of conductive material 48 around the non-graphene materials 26 and 34 can enable improved electrical connection between contact 50 and the materials 26 and 34 relative to that which would be achieved in the absence of the conductive material extending at least partially around materials 26 and 34. This can enable current to readily pass from electrical contact 50 into materials 26 and 34. Subsequently, the current can pass into graphene regions 22 and 30 along interconnect 36 by taking advantage of the large amount of surface interface between the graphene regions and the materials 26 and 34. The current can then move rapidly through the interconnect due to the high current density of the graphene, and subsequently the current may be transferred into another contact analogous to contact 50 to direct the current to another electrical component. Thus, one or more contacts analogous to the shown contact 50, in combination with interconnect 36, may provide a compact and efficient structure for transferring current between components of an integrated circuit.

FIGS. 12-17 illustrate an embodiment in which spaces 44 and 46 are formed to extend partially around non-graphene regions 26 and 34. In other embodiments etching may be conducted utilizing a suitable chemistry for a suitable period of time to entirely remove the graphene from between non-graphene regions 26 and 34 beneath contact opening 42. Such will form spaces 44 and 46 to extend entirely around non-graphene regions 26 and 34 in a portion of the interconnect 36 that is beneath contact opening 42.

FIG. 18 shows construction 10 at a processing stage analogous to that of FIG. 12, but in an embodiment in which spaces 44 and 46 have been formed to extend entirely around non-graphene materials 26 and 34 in the portion of interconnect 36 directly beneath contact opening 42. The construction of FIG. 18 may be subsequently treated with methodology analogous to that described above with reference to FIG. 14 to form electrically conductive material within opening 42. FIG. 19 shows the construction of FIG. 18 after the electrically conductive material 48 has been formed within contact opening 42. The conductive material 48 extends entirely around non-graphene regions 26 and 34 in the portion of interconnect 36 beneath contact opening 48. In subsequent processing (not shown), the electrically conductive material 48 can be removed from over insulative material 40 with processing analogous to that described above with reference to FIG. 16, if so desired.

The processing described above with reference to FIGS. 12-19 forms electrical contact to interconnect 36 by first removing graphene relative to non-graphene material to form spaces, and then forming electrically conductive material within the spaces. Another method of forming electrical contact to interconnect 36 is to punch at least partially through the interconnect to form a hole that extends at least partially through the interconnect, and to then form electrically conductive material within the hole. Such method is described with reference to FIGS. 20-30.

Figure 20:
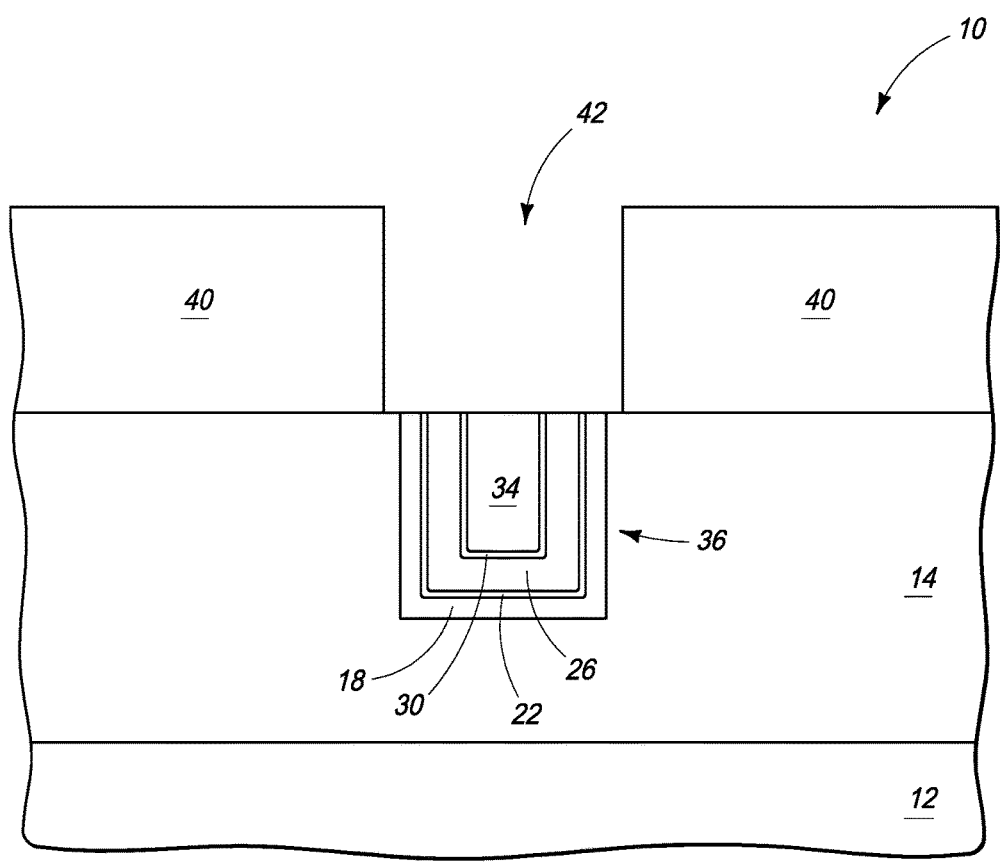
FIGS. 20 and 21 are a cross-sectional side view and a diagrammatic top view of the semiconductor construction of FIGS. 10 and 11, and represent a processing stage of another example embodiment. The cross-section of FIG. 20 is along the line 20-20 of FIG. 21.
Figure 21:
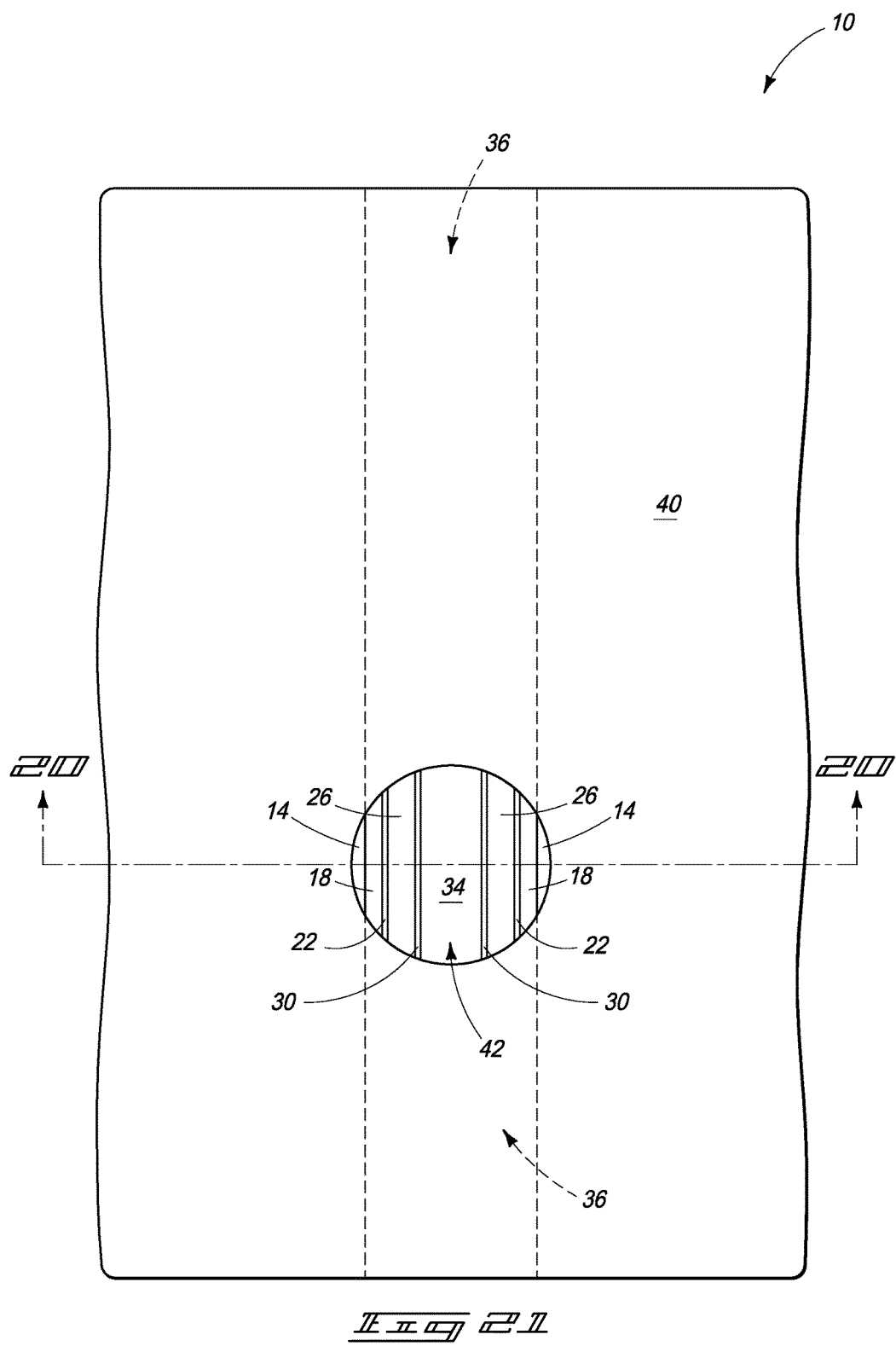

Referring to FIGS. 20 and 21, construction 10 is shown at the same processing stage discussed above with reference to FIGS. 10 and 11. Accordingly, the construction comprises a contact opening 42 extending through electrically insulative material 40 to expose an upper surface of interconnect 36.

Figure 22:
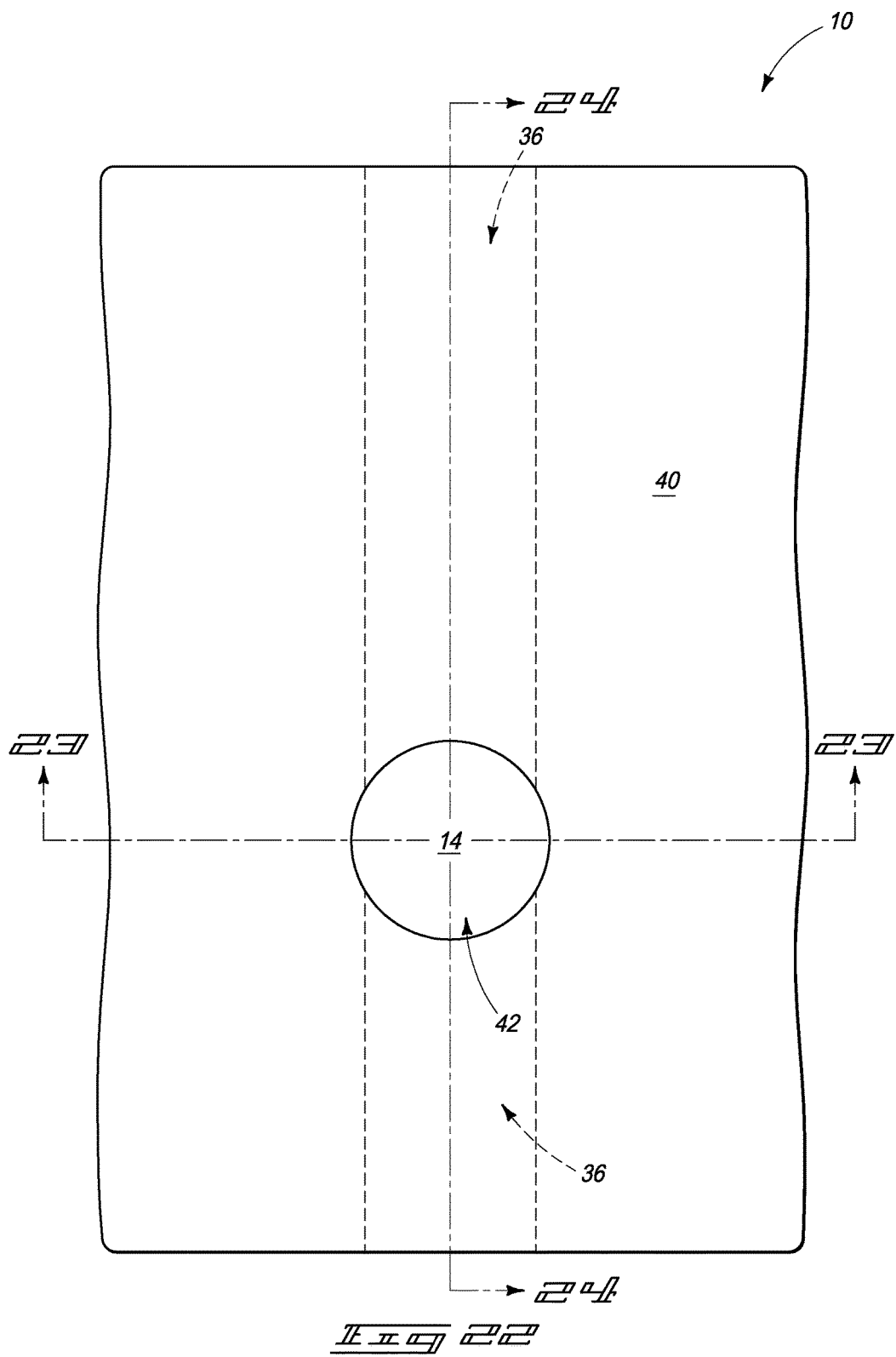
Figure 23:
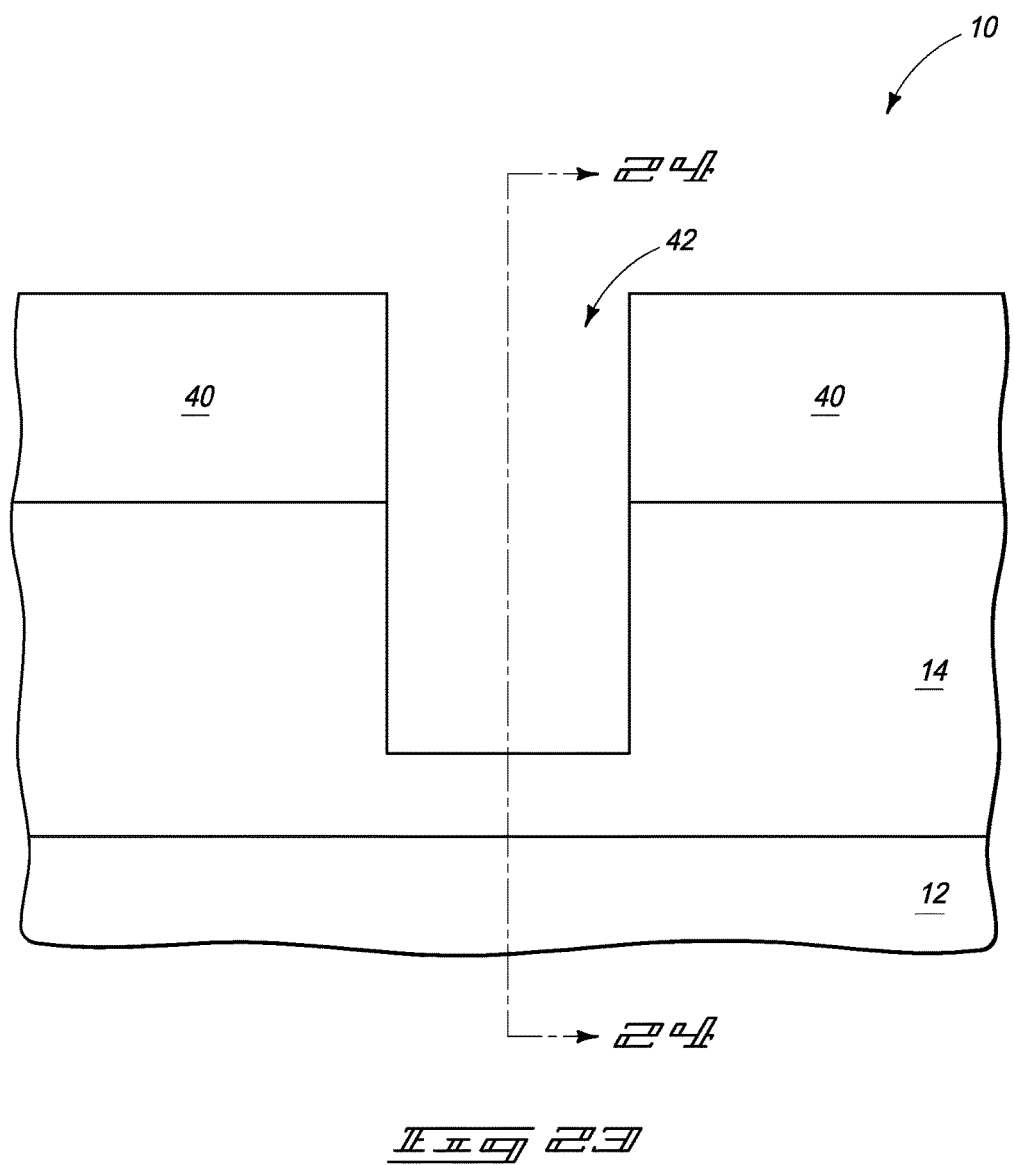

Referring to FIGS. 22-24, opening 42 is extended through interconnect 36 and into insulative material 14 with one or more etches. In the shown embodiment opening 42 is extended entirely through interconnect 36. In other embodiments (not shown) opening 42 may be extended only partially through interconnect 36.

Referring to FIGS. 25-27, electrically conductive material 48 is formed across material 40 and within opening 42. The electrically conductive material 48 has good electrical contact with any of the non-graphene regions 18, 26 and 34 that are electrically conductive due to the amount of surface of material 48 in direct contact with the regions 18, 26 and 34 at interfaces of material 48 and the regions 18, 26 and 34.

Figure 29:
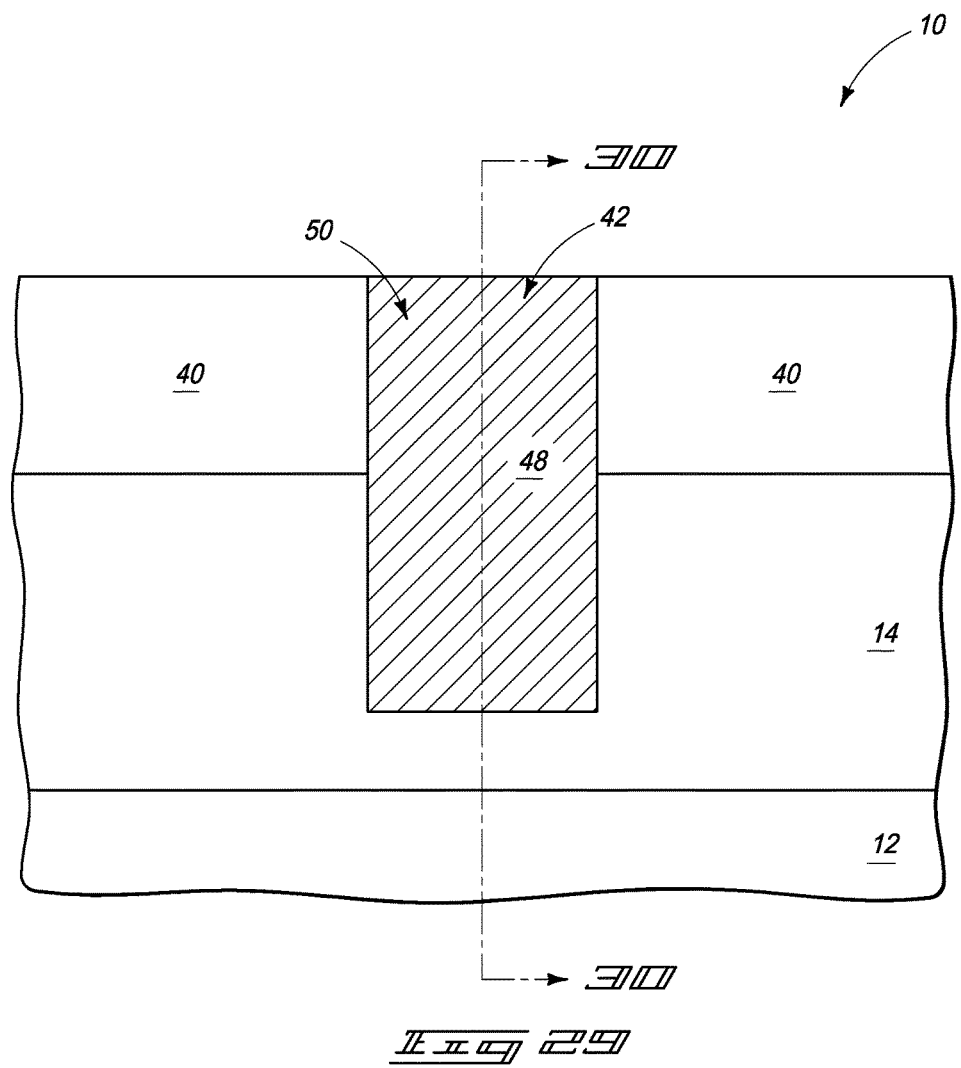

Referring to FIGS. 28-30, conductive material 48 is removed from over an upper surface of material 40 by planarization (for instance, chemical mechanical polishing) to form electrical contact 50 within the opening 42.

In subsequent processing, additional levels of interconnects may be formed across a semiconductor substrate. For instance, FIG. 31 shows the materials 18, 22, 26, 30 and 34 forming a first interconnect structure 100 directly over material 14 of the substrate, and forming a second interconnect structure 102 at another level above the level of the first interconnect structure. An electrically conductive material 104 extends through the second interconnect structure 102 to electrically tie it to the electrically conductive material 48, and to thereby electrically tie it to the first interconnect structure 100. The conductive material 104 may comprise copper or any other suitable material.

Although the second interconnect structure 102 is shown to comprise identical materials 18, 22, 26, 30 and 34 as the first interconnect structure 100, in other embodiments the second interconnect structure may comprise different materials than the first interconnect structure.

In the shown embodiment the material 18 of the second interconnect structure 102 directly contacts the electrically conductive material 48 of the electrical contact 50. In other embodiments the material 18 of the second interconnect structure may be spaced from the contact 50 by an electrically insulative material. In some embodiments the material 18 of the second interconnect structure 102 may be electrically insulative, and in some embodiments the material 18 of the second interconnect structure may be electrically conductive.

The various methods and structures described above may be utilized to achieve high current density in a circuit by maintaining a low contact resistance as current flows between graphene and conductive layers along interconnects and within vias.

The interconnects discussed above may be utilized in integrated circuits. Such integrated circuits may be incorporated into electronic systems. The electronic systems may be any of numerous electronic systems, such as, for example, computers, cars, airplanes, clocks, cellular phones, etc.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. An electrical interconnect, comprising:
an electrically conductive laminate structure; the laminate structure comprising multiple regions nested within one another; one of said nested regions being a graphene region and others of the nested regions being non-graphene regions; the graphene region being sandwiched between a pair of non-graphene regions; the laminate structure comprising an uppermost surface that contains segments of the graphene region and of the non-graphene regions; at least one of the non-graphene regions being electrically conductive;
an electrically insulative material over the upper surface of the laminate structure, and having an opening extending therethrough to a portion of the laminate structure; said portion differing from other portions of the laminate structure by having space between the pair of non-graphene regions instead of having graphene between the non-graphene regions; and
electrically conductive material within the opening and within the space.

2. The electrical interconnect of claim 1 wherein said at least one of the non-graphene regions comprises one or both of copper and nickel.

3. The electrical interconnect of claim 1 the electrically conductive material comprises at least one metal.

4. A method of forming an electrical interconnect, comprising:
forming an electrically conductive laminate structure; the laminate structure comprising multiple regions nested within one another; one of said nested regions being a graphene region and others of the nested regions being non-graphene regions; the graphene region being sandwiched between a pair of non-graphene regions; the laminate structure comprising an uppermost surface that contains segments of the graphene region and of the non-graphene regions; at least one of the non-graphene regions being electrically conductive;
forming an electrically insulative material over the upper surface of the laminate structure;
forming an opening extending through the insulative material to the upper surface of the laminate structure;
extending the opening at least partially through the laminate structure; and
forming electrically conductive material within the opening.

5. The method of claim 4 wherein opening is extended entirely through the laminate structure.

6. The method of claim 4 wherein opening is extended only partially through the laminate structure.

7. The method of claim 4 wherein both of said non-graphene regions are electrically conductive.

8. The method of claim 4 wherein only one of said non-graphene regions is electrically conductive.

* * * * *